(12) United States Patent
Trotta et al.

(10) Patent No.: US 11,592,479 B2
(45) Date of Patent: Feb. 28, 2023

(54) ANTENNA IN PACKAGE PRODUCTION TEST

(71) Applicant: Infineon Technologies AG, Neubiberg (DE)

(72) Inventors: Saverio Trotta, Munich (DE); Ashutosh Baheti, Munich (DE); Reinhard-Wolfgang Jungmaier, Alkoven (AT); Dennis Noppeney, Cologne (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/377,543

(22) Filed: Jul. 16, 2021

(65) Prior Publication Data

US 2021/0341536 A1    Nov. 4, 2021

Related U.S. Application Data

(63) Continuation of application No. 16/528,199, filed on Jul. 31, 2019, now Pat. No. 11,092,643.

(51) Int. Cl.
*G01R 31/00* (2006.01)
*G01R 31/28* (2006.01)
(Continued)

(52) U.S. Cl.
CPC ......... *G01R 31/3025* (2013.01); *G01R 1/045* (2013.01); *G01R 1/0425* (2013.01);
(Continued)

(58) Field of Classification Search
CPC ........ G01R 31/00; G01R 31/02; G01R 31/28; G01R 31/302; G01R 29/10; G01R 1/02; G01R 1/04; G01R 1/067; G01R 1/073
See application file for complete search history.

(56) References Cited

U.S. PATENT DOCUMENTS

2011/0267086 A1    11/2011   Pagani
2017/0102409 A1     4/2017   Sarhad et al.
(Continued)

FOREIGN PATENT DOCUMENTS

| EP | 2600533 A1 | 6/2013 |
|---|---|---|
| WO | 2015094177 A1 | 6/2015 |
| WO | 2019133097 A1 | 7/2019 |

OTHER PUBLICATIONS

Bhattacharya, S et al., "A Built-In Loopback Test Methodology for RF Transceiver Circuits using Embedded Sensor Circuits", Proceedings of the 13th Asian Test Symposium (ATS 2004), 6 pages.

*Primary Examiner* — Neel D Shah
(74) *Attorney, Agent, or Firm* — Slater Matsil, LLP

(57) ABSTRACT

A test assembly for testing an antenna-in-package (AiP) device includes a socket over a circuit board, where the socket includes an opening for receiving the AiP device; a plunger configured to move along sidewalls of the opening, where during testing of the AiP device, the plunger is configured to cause the AiP device to be pressed towards the circuit board such that the AiP device is operatively coupled to the circuit board via input/output connections of the AiP device and of the circuit board; and a loadboard disposed within the socket and between the plunger and the AiP device, where the loadboard includes a coupling structure configured to be electromagnetically coupled to a transmit antenna and to a receive antenna of the AiP device, so that testing signals transmitted by the transmit antenna are conveyed to the receive antenna externally relative to the AiP device through the coupling structure.

20 Claims, 16 Drawing Sheets

(51) Int. Cl.

| | |
|---|---|
| *G01R 29/10* | (2006.01) |
| *G01R 1/04* | (2006.01) |
| *G01R 1/067* | (2006.01) |
| *G01R 1/073* | (2006.01) |
| *G01R 31/302* | (2006.01) |
| *H04B 17/17* | (2015.01) |
| *H01Q 1/22* | (2006.01) |

(52) U.S. Cl.
CPC ........... *H01Q 1/2283* (2013.01); *H04B 17/17* (2015.01); *G01R 31/002* (2013.01)

(56) References Cited

U.S. PATENT DOCUMENTS

| | | |
|---|---|---|
| 2017/0229754 A1 | 8/2017 | Lee et al. |
| 2017/0279491 A1 | 9/2017 | Lam |
| 2018/0149674 A1 | 5/2018 | Bock et al. |
| 2019/0162767 A1 | 5/2019 | Wang et al. |
| 2019/0310314 A1* | 10/2019 | Liu .................... G01R 31/2822 |
| 2020/0072886 A1* | 3/2020 | Fang ....................... G01R 29/10 |
| 2020/0194871 A1 | 6/2020 | Moallem et al. |

* cited by examiner

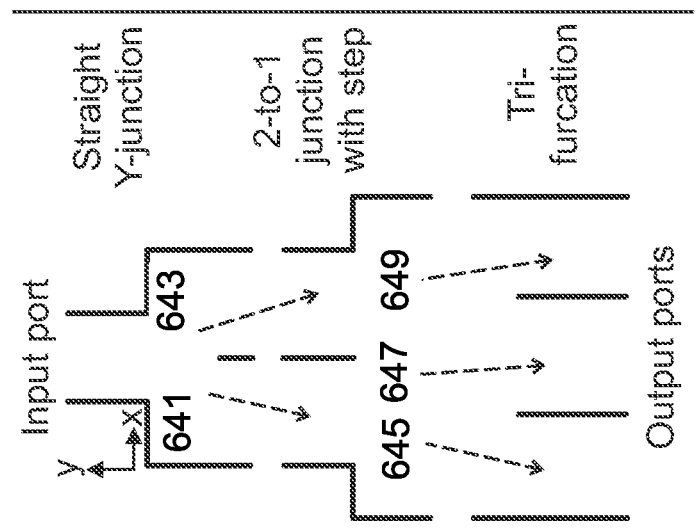
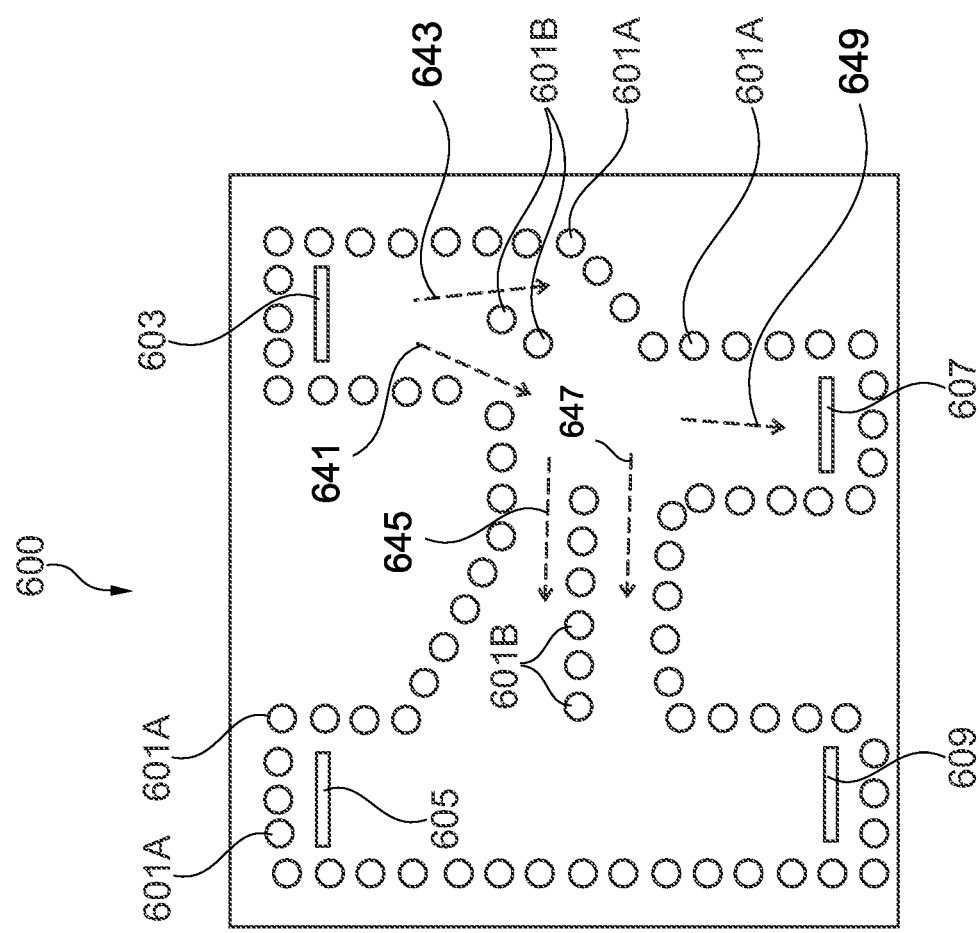
Fig. 12A
Fig. 12B

ANTENNA IN PACKAGE PRODUCTION TEST

This application is a continuation of U.S. patent application Ser. No. 16/528,199, filed on Jul. 31, 2019, and entitled "Antenna-In-Package Production Test," which application is incorporated herein by reference.

TECHNICAL FIELD

The present invention relates generally to a system and method for semiconductor packages, and, in particular embodiments, to antenna-in-package (AiP) devices and testing of AiP devices.

BACKGROUND

Antenna-in-package (AiP) represents a new trend in integrated circuit (IC) packaging which is an enabler of smaller and highly integrated semiconductor devices that includes integrated circuits (ICs) (e.g., base-band IC and RF transceiver IC) and an antenna inside a same package. Antenna-in-package allows integration of complex RF components together with base-band circuitry into a self-contained module. AiP devices not only reduce the footprint of the functional modules they integrated, but also facilitate the work of system integrators. For example, the system integrators no longer have to design complex RF circuits at the application printed circuit board (PCB) level. Moreover, the overall size of the complete application is reduced.

The reduced size and high integration density of AiP devices, however, pose challenges for the testing of the AiP devices, e.g., during manufacturing and/or application. For example, electrical connections between the ICs and the integrated antenna within the AiP device may be tested to confirm that the electrical connections are reliable. The integrated antennas may be tested to ensure that all of the integrated antennas (e.g., copper patches) are formed properly and connected properly to the ICs, and that the AiP device is functioning properly. There is a need in the art for test assemblies and test methods that can test AiP devices efficiently.

SUMMARY

In accordance with an embodiment of the present invention, a test assembly for testing an antenna-in-package (AiP) device includes a socket over a first surface of a circuit board, wherein the socket comprises an opening for receiving the AiP device during testing of the AiP device; a plunger configured to move along sidewalls of the opening of the socket, wherein during the testing of the AiP device, the plunger is configured to cause the AiP device to be pressed towards the circuit board such that the AiP device is operatively coupled to the circuit board via input/output (I/O) connections of the AiP device and of the circuit board; and a loadboard disposed within the socket and between the plunger and the AiP device, wherein the loadboard comprises a coupling structure configured to be electromagnetically coupled to a transmit antenna of the AiP device and to a receive antenna of the AiP device, so that testing signals transmitted by the transmit antenna of the AiP device are conveyed to the receive antenna of the AiP device externally relative to the AiP device through the coupling structure.

In accordance with an embodiment of the present invention, a loadboard for testing an antenna-in-package (AiP) device includes a first metal layer proximate to a first side of the loadboard, the first metal layer comprising metal patterns that include a coupling structure, the coupling structure comprising a first antenna and a second antenna, wherein during testing, the first side of the loadboard is configured to face the AiP device, wherein the AiP device has a transmit (Tx) antenna and a receive (Rx) antenna, wherein during the testing, the first antenna is configured to be electromagnetically coupled to the Tx antenna, and the second antenna is configured to be electromagnetically coupled to the Rx antenna such that testing signals transmitted by the transmit antenna of the AiP device are conveyed to the receive antenna of the AiP device externally relative to the AiP device through the coupling structure; a first ground plane proximate to a second side of the loadboard opposing the first side of the loadboard; and first dielectric layers between the first metal layer and the first ground plane.

In accordance with an embodiment of the present invention, a method of testing an antenna-in-package (AiP) device includes placing the AiP device in an opening of a socket, the socket disposed over a circuit board; moving a plunger along sidewalls of the opening to cause the AiP device to be pressed toward the circuit board such that the AiP device is electrically coupled to the circuit board via input/output connections of the AiP device and of the circuit board, wherein a loadboard is disposed between the plunger and the AiP device while moving the plunger, wherein the loadboard comprises a coupling structure including a first antenna and a second antenna; receiving, by the first antenna, a radio frequency (RF) signal sent from a transmit (Tx) antenna of the AiP device; relaying, by a coupling network, the RF signal received at the first antenna to the second antenna; and transmitting, by the second antenna, the RF signal relayed by the coupling network to a receive (Rx) antenna of the AiP device.

BRIEF DESCRIPTION OF THE DRAWINGS

For a more complete understanding of the present invention, and the advantages thereof, reference is now made to the following descriptions taken in conjunction with the accompanying drawings, in which:

FIGS. 12A and 12B illustrate a top view and a schematic view, respectively, of a waveguide in a loadboard, in an embodiment;

DETAILED DESCRIPTION OF ILLUSTRATIVE EMBODIMENTS

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a test assembly for AiP devices and methods of testing AiP devices.

In embodiments of the present invention, a test assembly for testing AiP devices includes a socket on an upper surface of test circuit board (e.g., a PCB), a plunger, and a loadboard attached to a bottom surface of the plunger. During the testing of an AiP device, the AiP device is disposed in an opening of the socket, and the plunger pushes (e.g., through the loadboard) the AiP device against the test circuit board such that external connectors of the AiP device are electrically coupled to respective conductive pads on the upper surface of the test circuit board. The loadboard is disposed between the AiP device and the plunger during the testing. The loadboard has antennas (e.g., metal patterns) that have a one-to-one correspondence with the antennas (e.g., transmit antenna(s) and receive antenna(s)) of the AiP device that are disposed, e.g., proximate to the upper surface of the AiP device. During the testing of the AiP device, the AiP device sends a radio frequency (RF) signal from a transmit (Tx) antenna of the AiP device. The RF signal is received by a first antenna of the loadboard, and the received RF signal at the first antenna of the loadboard is sent to a second antenna of the loadboard via a coupling network (e.g., transmission line, waveguide) in the loadboard or in the test assembly. The second antenna then transmits the RF signal back to a receive (Rx) antenna of the AiP device. The AiP device demodulates the received RF signal and produces an output for determining whether the AiP device is functioning properly. In some embodiments, the transmitted RF signal is a modulated carrier signal, which carrier signal is an output of a local oscillator (LO). The AiP device demodulates the received RF signal by mixing the received RF Signal with a reference signal (e.g., the output of the local oscillator or a scaled version thereof). Depending on the modulation method, the demodulated RF signal may be a direct current (DC) signal having a DC level, or an alternate current (AC) signal (e.g., a tone) having a signal level. The DC level or the signal level of the demodulated signal is then compared with a pre-determined range. If the DC level or the signal level of the demodulated signal is outside the pre-determined range, the AiP device is declared as defective.

Figure 1:
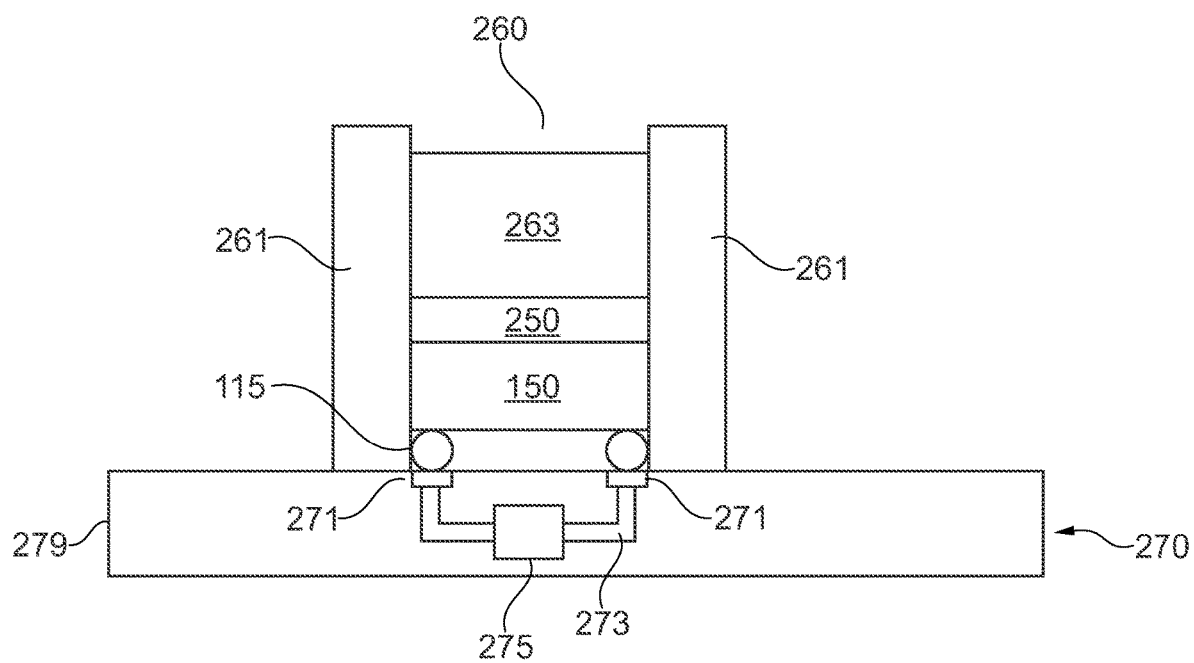
FIG. 1 illustrates a cross-sectional view of a test assembly for testing an AiP device, in an embodiment.

Referring now to FIG. 1, FIG. 1 illustrates a cross-sectional view of a test assembly for testing an AiP device 150, in an embodiment. Throughout the discussion herein, unless otherwise specified, similar numerals refer to the same or similar elements. The test assembly of FIG. 1 includes a test circuit board 270 (e.g., a PCB) which includes conductive pads 271 (e.g., copper pads) at an upper surface thereof, conductive lines 273, and functional circuits 275 which may include various electrical components (e.g., resistors, capacitors, inductors, transistors, and the like) electrically interconnected to perform pre-determined test functionalities.

Still referring to FIG. 1, the test assembly further includes a socket 261 on the test circuit board 270, a plunger 263, and a loadboard 250. During the testing of the AiP device iso, the AiP device 150 is received in the socket (e.g., inserted in an opening 260 of the socket 261), and the loadboard 250 is disposed between the AiP device 150 and the plunger 263. The plunger 263 moves along sidewalls of the openings 260 of the socket 261 and pushes (e.g., through the loadboard 250) the AiP device 150 down towards (e.g., against) the test circuit board 270 such that the AiP device 150 is operatively coupled (e.g., electrically coupled) to the test circuit board 270 through input/output (I/O) connections (e.g., external connectors 115) of the AiP device 150 and through I/O connections (e.g., conductive pads 271) of the test circuit board 270.

In the illustrated embodiment, the AiP device 150 is in direct contact with the test circuit board 270. For instance, the external connectors 115 of the AiP device 150 are in physical contact with respective conductive pads 271 on the upper surface of the test circuit board 270. Therefore, the test circuit board 270 provides I/O signal connection with the AiP device 150 through the conductive pads 271 and optionally provides power supply to the AiP device 150 as well. In other embodiments, the AiP device 150 is electrically coupled to the test circuit board 270 indirectly through an interposing structure disposed between the AiP device 150 and the test circuit board 270. The interposing structure may be, e.g., a PCB board having conductive pads on an upper surface of the PCB board (e.g., facing the AiP device iso) and on a lower surface of the PCB board (e.g., facing the test circuit board 270). The PCB board may also have conductive features (e.g., vias and/or metal lines) in the PCB board that electrically couple the conductive pads on the upper surface and the lower surface of the PCB board. In some embodiments, the locations of the conductive pads on the upper surface of the interposer structure (e.g., a PCB board) match those of the external connectors 115, and the locations of the conductive pads on the lower surface of the interposer structure (e.g., a PCB board) match those of the conductive pads 271, in which case the locations of the external connectors 115 do not have to match the locations of the conductive pads 271, because the interposer structure functions as a coupling device (e.g., an adaptor) between the AiP device 150 and the test circuit board 270.

In FIG. 1, the loadboard 250 is attached to a bottom surface of the plunger 263 and is disposed between the AiP device 150 and the plunger 263 during the testing. The loadboard 250 has a coupling structure that includes a plurality of antennas (e.g., metal patterns such as copper patches, see, e.g., 203 and 205 in FIG. 3) that are configured to be electromagnetically coupled to respective antennas (e.g., transmit antenna 143 and receive antenna 145 in FIG. 3) of the AiP device 150, so that testing signals transmitted by the transmit antenna of the AiP device 150 are conveyed to the receive antenna of the AiP device 150 externally relative to the AiP device 150 through the loadboard 250. Details of the loadboard 250 are discussed hereinafter.

Figure 2:
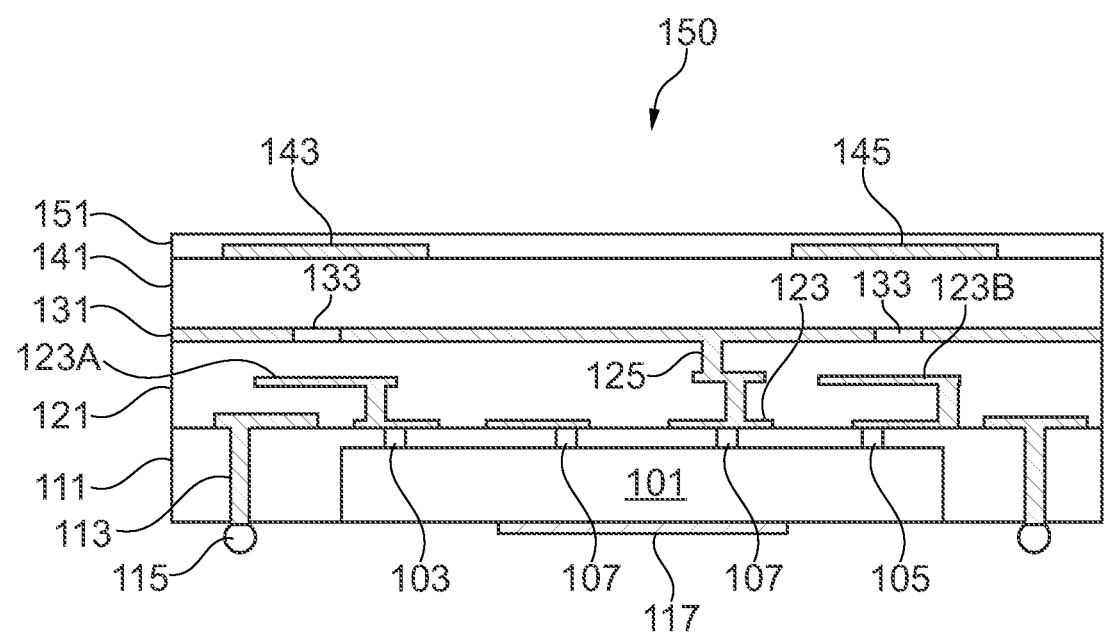
FIG. 2 illustrates a cross-sectional view of an AiP device, in an embodiment.

Referring now to FIG. 2, which is a cross-sectional view of the AiP device 150. The AiP device 150 includes at least one die 101, which may include one or more ICs such as a base-band IC and an RF transceiver IC. External connectors (e.g., die connectors) of the die 101 include a Tx port 103 (for transmitting RF signals), an Rx port 105 (for receiving RF signals), and input/output (I/O) ports 107 (for connecting to power supply and/or for sending/receiving digital signals into/out of the die 101). As illustrated in FIG. 2, the die 101 is embedded in a molding material 111 that surrounds the die 101. Upper surfaces of the external connectors of the die 101 are level with an upper surface of the molding material 111.

Still referring to FIG. 2, a redistribution structure is formed over and electrically coupled to the die 101. The redistribution structure includes conductive features such as conductive lines 123 and vias 125 that are formed in one or more dielectric layers 121. At least some of the conductive features of the redistribution structure are electrically coupled to the die 101. As illustrated in FIG. 2, the AiP device 150 further includes a ground plane 131 (e.g., a copper plane) over the dielectric layer 121, a dielectric layer 141 over the ground plane, and antennas (e.g., 143, 145) over the ground plane. The ground plane 131 has openings 133 (e.g., through-holes) and are grounded by, e.g., electrically coupling to an I/O port 107 that is electrically grounded. The antennas (e.g., 143, 145) include at least a Tx antenna 143 and an Rx antenna 145. In some embodiments, the antennas (e.g., 143, 145) are formed of metal patterns (e.g., copper patterns), although they may also be formed in any suitable manner using any suitable material known in the art. Throughout the discussion herein, copper is used as an example of the conductive material for, e.g., the antennas 143/145 and the ground plane 131, with the understanding that any other suitable conductive material may also be used.

To transmit an RF signal, die 101 generates the RF signal and sends the RF signal to the Tx port 103, which Tx port 103 may be electrically coupled to a conductive feature 123A in the redistribution structure of the AiP device 150. The conductive feature 123A radiates the RF signal, which travels through a respective opening 133 and is electromagnetically coupled to the Tx antenna 143. The RF signal is then transmitted by the Tx antenna 143. To receive an RF signal, the Rx antenna 145 picks up the RF signal (e.g., through electromagnetic coupling), the received RF signal is then electromagnetically coupled to the Rx port 105, e.g., through a respective opening 133 and a conductive feature 123B in the redistribution structure.

FIG. 2 further illustrates a dielectric layer 151 over the antennas 143/145. The dielectric layer 151 covers the upper surfaces of the antennas 143/145. In other embodiment, the upper surfaces of the antennas 143/145 are exposed. In addition, vias 113 are formed in the molding material 111 and extend through the molding material 111. The vias 113 electrically couple the die 101 to external connectors 115 (e.g., conductive pads or conductive balls) at the lower surface of the AiP device iso. Furthermore, the AiP device 150 may optionally have thermal pads 117 at the lower surface of the AiP device 150 for heat dissipation purpose. FIG. 2 is a non-limiting example of an AiP device. Other structures and configurations of the AiP device are possible and are fully intended to be included in the scope of the present disclosure.

Figure 3:
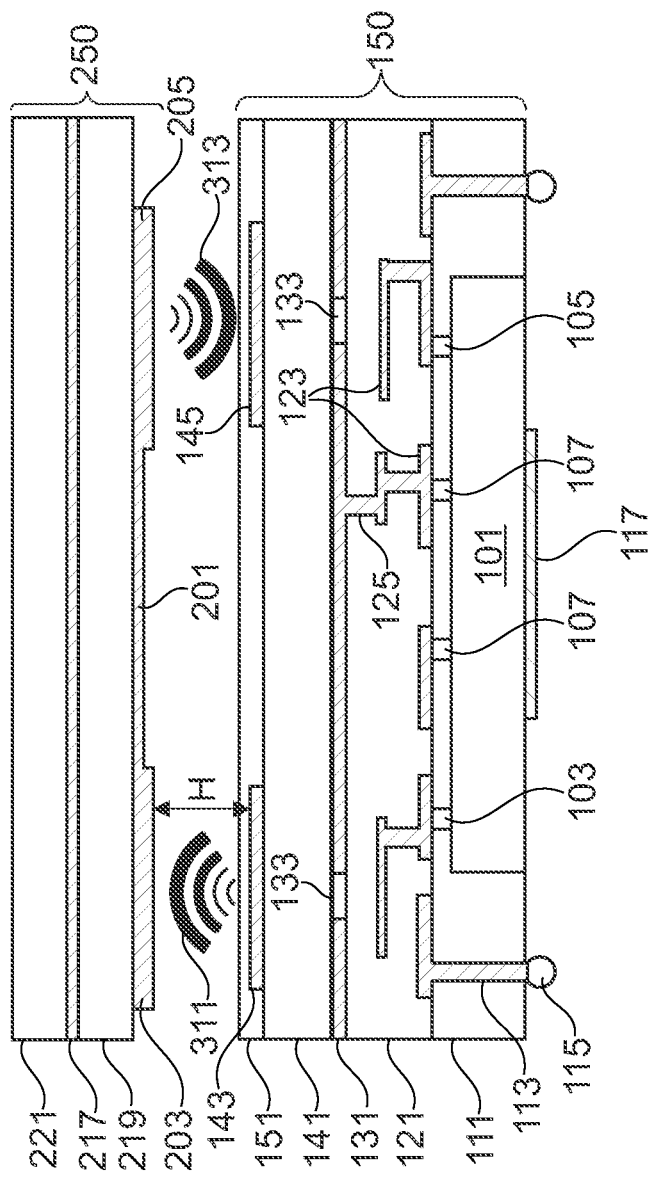
FIG. 3 is a cross-sectional view showing details of the electromagnetic coupling between an AiP device and a loadboard of a test assembly, in an embodiment.

FIG. 3 is a cross-sectional view illustrating an embodiment loadboard 250 and the electromagnetic coupling between the loadboard 250 and the AiP device 150 of FIG. 2 during the testing as illustrated in FIG. 1. For clarity, not all details of the loadboard 250 and not all details of the AiP device 150 are illustrated. The loadboard 250 includes dielectric layers (e.g., 219, 221) and metal layers (e.g., antennas 203/205, ground plane 217) formed on, in, or between the dielectric layers. The dielectric layers of the loadboard 250 can be formed of any dielectric material suitable for RF applications. For example, the dielectric layers of the loadboard 250 may use a same dielectric material used in the AiP device 150, or may use other high-performance RF materials such as Rogers 3003. The antennas (e.g., 203, 205) of the loadboard 250 may also be referred to as a coupling structure of the loadboard hereinafter. As will be discussed in more details hereinafter, the coupling structure is configured to be electromagnetically coupled to respective antennas (e.g., 143, 145) of the AiP device 150 during testing of the AiP device 150, such that testing signals (e.g., RF signals) transmitted by the transmit antenna of the AiP device 150 are conveyed to the receive antenna of the AiP device 150 externally relative to the AiP device 150 through the coupling structure. In some embodiments, the loadboard 250 further includes a coupling network (e.g., transmission lines, waveguides, or the like) that couples the antennas of the loadboard 250. In other embodiments, the coupling network is formed outside of the loadboard 250, such as in the plunger 263 (see, e.g., FIG. 7 and discussion thereof).

As illustrated in FIG. 3, during the testing of the AiP device iso, the AiP device 150 sends a radio frequency (RF) signal 311 (e.g., electromagnetic waves) from the Tx antenna 143. This RF signal serves as a test signal. The RF signal 311 is received by a first antenna 203 (e.g., a receive antenna) of the coupling structure of the loadboard 250 through electromagnetic coupling. The first antenna 203 and other antennas of the loadboard 250, such as a second antenna 205 (e.g., a transmit antenna), are formed of metal patterns (e.g., copper patterns), in some embodiments. In the discussion herein, the antennas (e.g., Tx antenna 143, Rx antenna 145) of the AiP device 150 and the antennas (e.g., 203, 205) of the loadboard 250 may also be referred to as patch antennas or slot antennas.

Still referring to FIG. 3, the RF signal 311 received at the first antenna 203 of the loadboard 250 is sent to the second antenna 205 of the loadboard via a coupling network (e.g., transmission line, waveguide) disposed in the loadboard or the test assembly. The cross-section of FIG. 3 illustrates conductive lines 201 (e.g., copper lines) between the first antenna 203 and the second antenna 205 as (part of) the coupling network. The coupling network may also include a matching network (see, e.g., 202 in FIG. 5 and the discussion hereof). The antennas (e.g., 203, 205) of the loadboard 250 are illustrated to be thicker than the conductive line 201 in FIG. 3. This is, of course, a non-limiting example. In other embodiments, the antennas (e.g., 203, 205) of the loadboard 250 and the conductive line 201 have a same thickness.

The received RF signal 311 at the first antenna is relayed (e.g., transmitted along the coupling network) from the first antenna 203 to the second antenna 205, and the second antenna 205 then transmits the relayed RF signal back to the Rx antenna 145 of the AiP device 150, e.g., as an RF signal 313. Once the AiP device 150 receives the RF signal 313, it demodulates the received RF signal 313, and may produce an output for determining whether the AiP device is functioning properly. Details of the demodulation and additional signal processing are discussed hereinafter with reference to FIGS. 14, 15A, 15B, 16, and 17.

Note that the antennas (e.g., 143, 145) of the AiP device 150 are spaced apart from (e.g., not in direct physical contact with) the antennas (e.g., 203, 205) of the loadboard 250 by a distance H, which may be between about 300 μm and about 500 μm, or between about 200 μm and about 300 μm, although other values are also possible and are fully intended to be included within the scope of the present disclosure. To facilitate testing of the AiP device iso, the distance H is set to an appropriate value to achieve a target range of attenuation (e.g., between about 10 dB and about 20 dB) for the RF signals (e.g., 311, 313) transmitted between a pair of respective antennas (e.g., 143 and 203, or 145 and 205). If the distance H is too small, the received RF signal level may be too strong (due to little attenuation of the RF signal) and may cause signal saturation, thereby distorting the received signal. Conversely, if the distance H is too large, there may be too much attenuation in the RF transmission channel such that the received RF signal is too weak to be detected or processed. In some embodiments, the distance H, and/or the materials/structures of the loadboard 250, are chosen to achieve an attenuation between about 10 dB and about 20 dB for the RF signal. Such an attenuation level may allow proper testing of the RF circuitry of the AiP device 150. For example, the gains of the power amplifiers in the AiP device 150 may be set to proper values that correspond to normal operating conditions of the AiP device 150.

FIG. 3 illustrates an airgap between the AiP device 150 and the loadboard 250 to achieve a distance of H between respective antennas. The airgap may be maintained by inserting a spacer (see, e.g., 450 in FIG. 10) between the AiP device 150 and the loadboard 250. In other embodiments, dielectric layer(s) may be formed at the lower surface of the loadboard 250 (see, e.g., 501 in FIG. 11) to cover the antennas (e.g., 203, 205) and to maintain a distance H between respective antennas. In yet other embodiments, the antennas (e.g., 203, 205) of the loadboard 250 may be recessed (see, e.g., FIGS. 8A and 8B) from a lower surface of a dielectric layer (see, e.g., 215 in FIGS. 8A and 8B) to maintain a distance H from antennas (e.g., 143, 145) of the AiP device iso. Details are discussed hereinafter.

Figure 5:
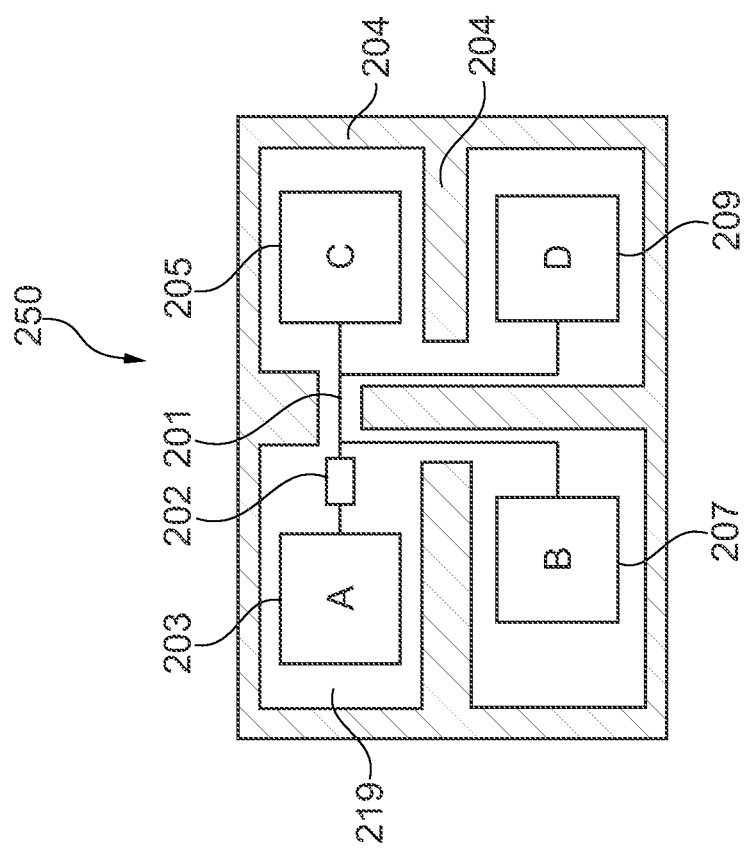
FIG. 5 is a bottom view of a loadboard, in an embodiment.
Figure 4:
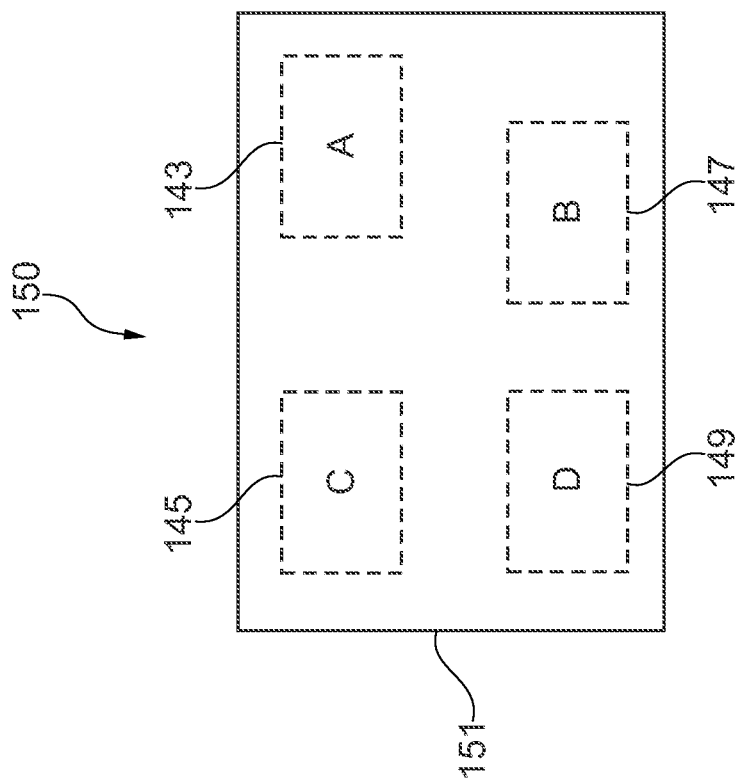
FIG. 4 is a top view of an AiP device, in an embodiment.

FIG. 4 illustrates a top view of the AiP device 150 in FIG. 3, and FIG. 5 illustrates a bottom view of the loadboard 250 in FIG. 3, in an embodiment. For clarity, not all details are illustrated in FIGS. 4 and 5. FIG. 4 illustrates four patch antennas at the top surface of the AiP device 150, which includes the Tx antenna 143 and the Rx antenna 145. Additionally, two Rx antennas 147 and 149, which are not visible in the cross-section of FIG. 3, are also illustrated. The antennas 143, 145, 147, 149 are illustrated using dashed lines since they are covered by the dielectric layer 151 (see FIG. 3).

FIG. 5 illustrates the bottom view of the loadboard 250, which have four antennas 203, 205, 207 and 209. The antennas 207 and 209 are not in the cross-section of FIG. 3 thus not visible in FIG. 3. In the example of FIG. 5, the antenna 203 functions as a receive antenna to receive the RF signal transmitted from the Tx antenna 143 (see FIG. 4) of the AiP device 150. Other antennas of the loadboard 250, such as antennas 205, 207 and 209, function as transmit antennas to transmit the RF signal received by the antenna 203 back to respective receive antennas (145, 147, and 149 in FIG. 4) of the AiP device 150.

Still referring to FIG. 5, the antenna 203 (receive antenna) is coupled to the antennas 205, 207 and 209 (transmit antennas) through a coupling network, which includes conductive lines 201 (e.g., copper lines) and a matching network 202. The matching network 202 includes components for impedance matching, and also functions as a power splitter to split the received RF signal three-way so that the received RF signal is relayed (e.g., transmitted) to the antennas 205, 207 and 209. In some embodiments, the length, the shape, the size, and/or other design parameters of the coupling network are designed to introduce a pre-determined delay (e.g., a pre-determined phase delay) between the RF signal received at the (receive) antenna 203 and a transmit antenna, such as 205, 207, or 209. FIG. 5 further illustrates a ground pattern 204 (e.g., a copper ground pattern) around the antennas 203, 205, 207, and 209 and around the coupling network. The ground pattern 204 may advantageously improve insulation of the RF signal and reduce electromagnetic interference (EMI) to other devices. FIG. 5 also illustrates portions of the dielectric layer 219 exposed by the ground pattern 204 and the antennas 203, 205, 207 and 209.

The antennas 203, 205, 207 and 209 of the loadboard 250 have a one-to-one correspondence with the antennas 143, 145, 147, 149 of the AiP device iso, such that when the bottom of the loadboard 250 (after being flipped over) faces the top surface of the AiP device 150 during the testing, each of the antennas 203, 205, 207 and 209 is disposed over a respective one of the antennas 143, 145, 147, 149 for RF transmission/reception.

Figure 6:
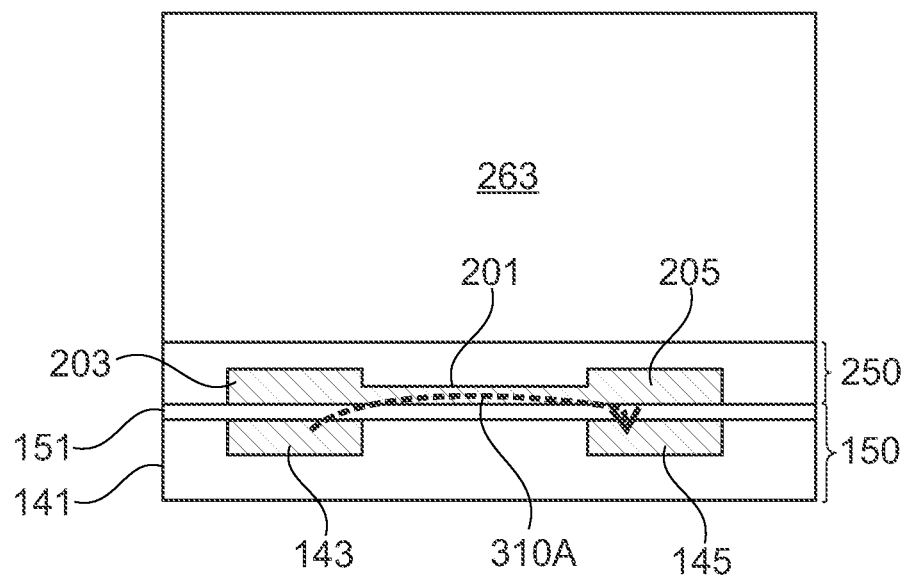
FIGS. 6 and 7 are cross-sectional views illustrating various coupling paths between an AiP device and a test assembly, in various embodiments.
Figure 7:
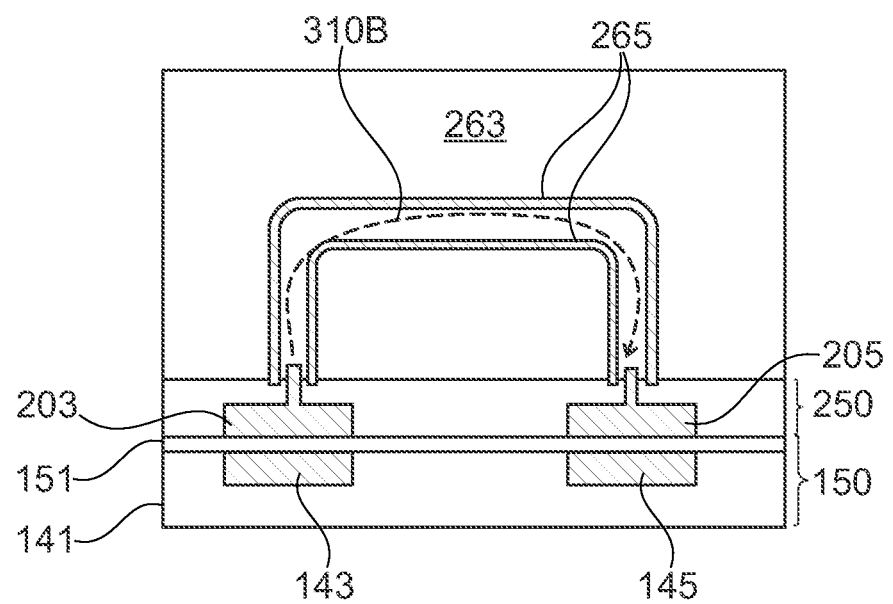

FIGS. 6 and 7 illustrate two different embodiment of the coupling network between the receive antenna 203 and the transmit antenna 205 of the coupling structure of the loadboard 250. In FIG. 6, the coupling network includes transmission lines (e.g., conductive line 201) in the loadboard 250. In other words, the coupling network forms part of the loadboard 250. In FIG. 7, the receive antenna 203 and the transmit antenna 205 of the loadboard 250 are coupled by the coupling network which is located within the plunger 263. In the example of FIG. 7, the coupling network includes a waveguide 265. The waveguide 265 is formed of, e.g., a metallic material coated by a polymer. A suitable formation method, such as 3-D printing, may be used to form the waveguide 265. In other embodiments, the waveguide is formed in the loadboard 250 using vias. More details regarding forming waveguide using vias are discussed hereinafter with reference to FIGS. 12A, 12B and 13. In other embodiments, the coupling network located in the plunger may be formed using transmission lines.

The loadboard 250 illustrated in FIG. 3 is merely a non-limiting example, other designs are possible and are fully intended to be included within the scope of the present disclosure. Various designs and structures for the loadboard 250 are discussed hereinafter.

Figure 8A:
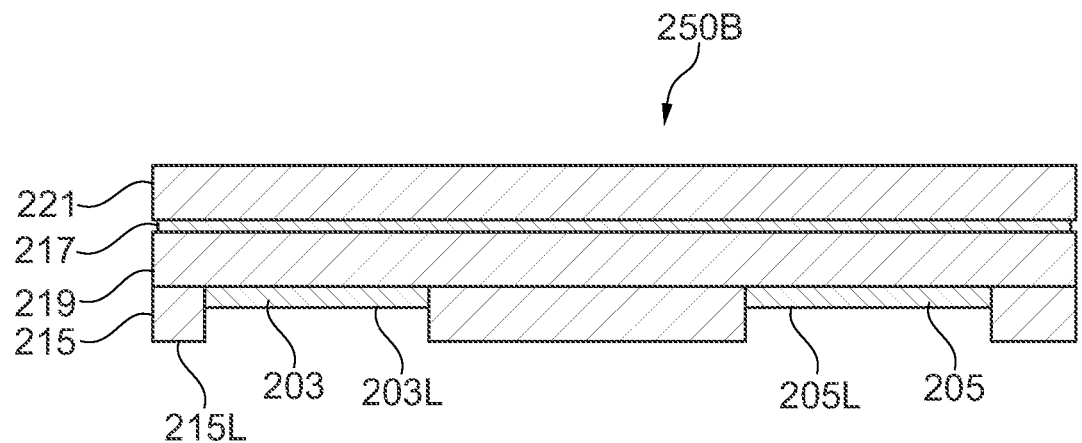
FIGS. 8A and 8B are cross-sectional views of various embodiment loadboards.
Figure 8B:
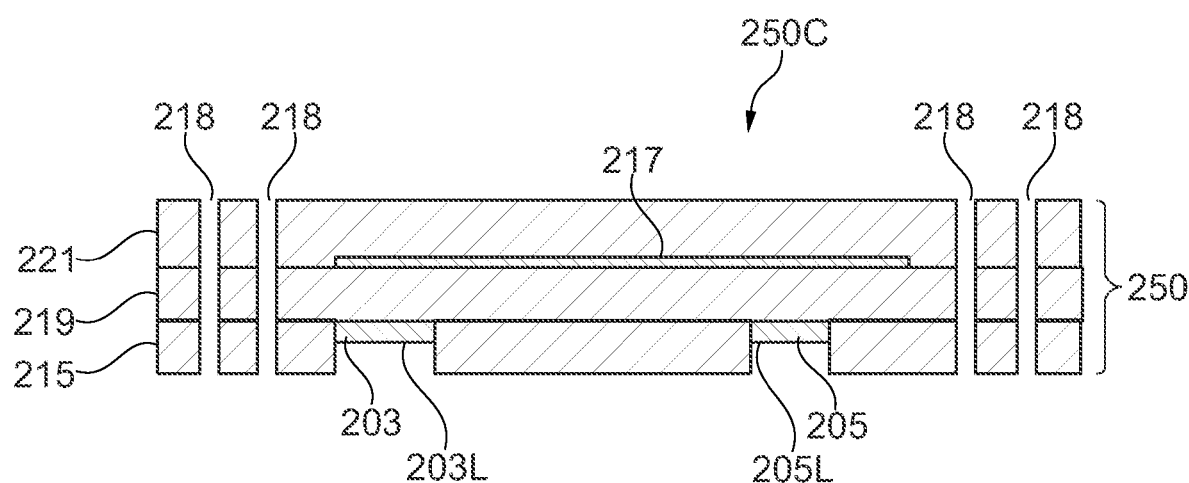

FIGS. 8A and 8B illustrate two embodiment loadboards 250B and 250C. The loadboard 250B in FIG. 8A is similar to the loadboard 250 in FIG. 3, but with an additional dielectric layer 215 under the dielectric layer 219. In particular, the antennas 203 and 205 are formed in the dielectric layer 215, with a lower surface 203L of the antenna 203 and a lower surface 205L of the antennas 205 being recessed from a lower surface 215L of the dielectric layer 215. The dielectric layer 215 may therefore help to maintain the target distance H (see H in FIG. 3) between the antennas 203/205 and respective antennas on the upper surface of the AiP device iso. The coupling network (see, e.g., conductive line 201 in FIG. 3) between the antennas 203 and 205 may not be in the cross-section of FIG. 8A, thus not illustrated.

The loadboard 250C in FIG. 8B is similar to the loadboard 250B in FIG. 8A, but with a plurality of through-holes 218. In some embodiments, the plunger 263 (see FIG. 2) has a vacuum mechanism for handling (e.g., picking up and moving) the AiP device 150. By designing the loadboard 250C with the through-holes 218, the plunger 263 can pick up both the loadboard 250 and the AiP device 150, because the suction created by the vacuum mechanism can pick up the loadboard 250, and can go through the through-holes 218 and pick up the AiP device 150. In other embodiments, the loadboard and the AiP device are handled by different tools (e.g., plungers, pick-and-place tools, or the like) during the testing.

Figure 9:
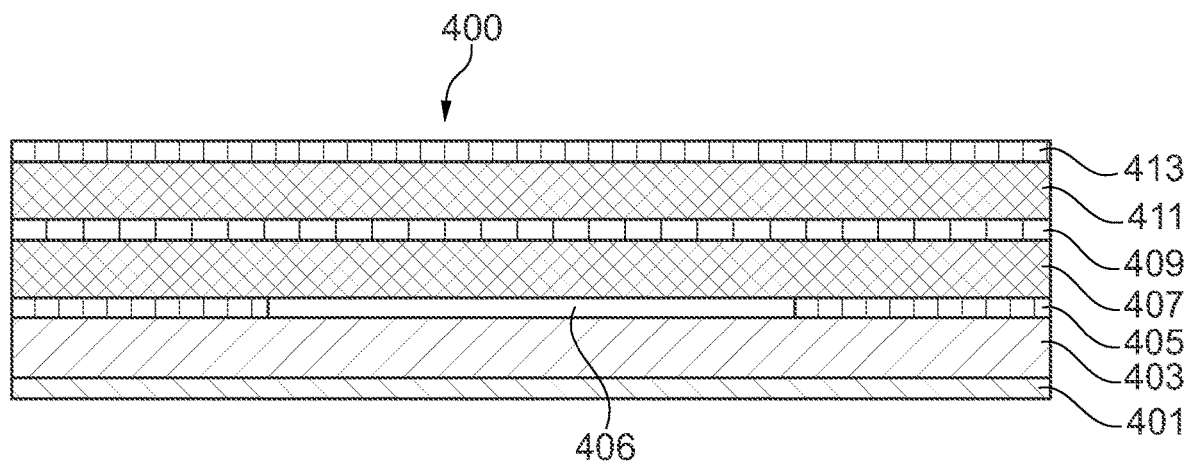
FIG. 9 is a cross-sectional view illustrating the layer stack of a loadboard, in an embodiment.

FIG. 9 illustrates the cross-section of a portion of a loadboard 400. For simplicity, not all features of the loadboard 400 are illustrated. The loadboard 400 of FIG. 9 shows a metal layer 401, which may be a copper layer with a suitable thickness, such as about 18 µm. The metal layer 401 is patterned (e.g., using photolithography and etching) to form the patch antennas (such as 203, 205, 207, and 209 in FIG. 5) and the conductive lines (such as 201 in FIG. 5) of the loadboard 400. In other words, the metal layer 401 faces the AiP device 150 during the testing of the AiP device iso. A dielectric layer 403, such as a layer of Taconic material having a thickness of about 127 µm, is sandwiched between the metal layer 401 and a metal layer 405, which metal layer 405 may be a copper layer with a thickness of about 35 µm. The metal layer 405 has openings 406 (e.g., through-holes) formed therein. Over the metal layer 405 are a first ground plane 409 (e.g., a copper plane of about 35 µm thick) and a second ground plane 413 (e.g., a copper plane of about 18 µm thick), with a dielectric layer 407 between the first ground plane 409 and the metal layer 405, and with a dielectric layer 411 between the second ground plane 413 and the first ground plane 409. The dielectric layers 407 and 411 may be, e.g., formed of $FR_4$ material and may have a thickness of about 200 µm. The materials and the dimensions (e.g., thickness) of the loadboard 400 are chosen to provide an RF attenuation level within a target range (e.g., between 10 dB and about 20 dB). Having the metal layers (e.g., 405, 409, 413) in the loadboard 400 may help to adjust (e.g., reduce) the RF attenuation of the loadboard 400. In addition, the metal layers may advantageously increase the bandwidth of the loadboard 400 (e.g., the bandwidth of RF signals the loadboard 400 is able to transmit/receive). The layer stack of the loadboard 400 illustrated in FIG. 9 thus provides multiple layers of materials, each providing an opportunity to fine tune the performance of the loadboard 400.

Figure 10:
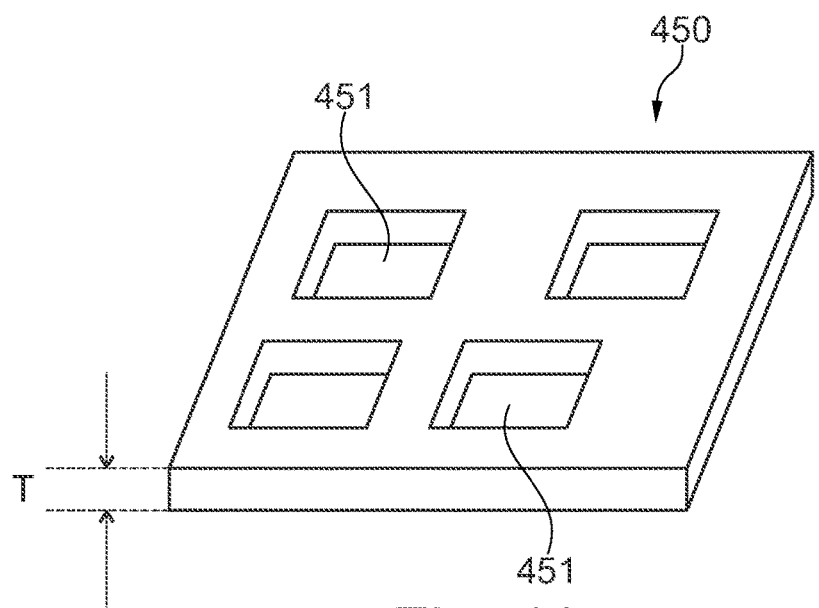
FIG. 10 illustrates a perspective view of a spacer used in a test assembly, in an embodiment.

The loadboard 400 in FIG. 4 has the patch antennas formed in the metal layer 401, and therefore, to maintain a target distance between the patch antennas and the respective Tx/Rx antennas of the AiP device 150, a spacer, or shim, 450 illustrated in FIG. 10 may be used between the loadboard 400 and the AiP device 150.

Referring to FIG. 10, the spacer 450 may be formed of a suitable material such Acrylonitrile Butadiene Styrene (ABS), Polytetrafluoroethylene (PTFE), $FR_4$, or the like. The dimensions (e.g., width, length) of the spacer 450 match those of the top surface of the AiP device 150 (or the bottom surface of the loadboard), such that the spacer 450 may be inserted between the loadboard and the AiP device 150 in the socket 261 (see FIG. 1) during testing and reliably maintained in position therein. However, the spacer 450 may have dimensions which differ from that of the top surface of the AiP device 150. In the example of FIG. 10, the spacer 450 has four openings 451, where locations of the openings 451 correspond to locations of the antennas at the upper surface of the AiP device 150 (or antennas at the bottom surface of the loadboard). A thickness T of the spacer 450 is chosen to help maintain the target distance H (see FIG. 3). In some embodiments, the spacer 450 may be integrated into the loadboard such that the spacer 450 becomes a part of the loadboard. For example, the spacer 450 may be attached (e.g., glued) to the lower surface of the metal layer 401 of the loadboard 400 of FIG. 9, such that the loadboard 400 has a built-in spacer.

Figure 11:
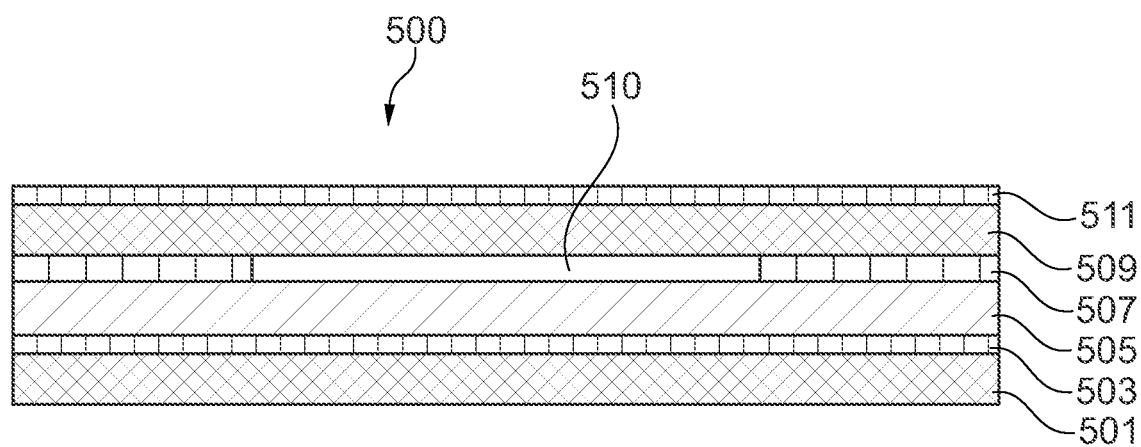
FIG. 11 is a cross-sectional view illustrating the layer stack of a loadboard, in an embodiment.

FIG. 11 illustrates the cross-section of a portion of a loadboard 500. For simplicity, not all features of the loadboard 500 are illustrated. The loadboard 500 of FIG. 11 shows a dielectric layer 501 that faces the AiP device 150 during the testing. The dielectric layer 501 may be formed of, e.g., $FR_4$ material and may have a thickness of about 200 µm. The dielectric layer 501 may help to maintain a target distance H (see FIG. 3) between the antennas of the loadboard 500 and the antennas of the AiP device 150.

Still referring to FIG. 11, a metal layer 503 (e.g., a copper layer having a suitable thickness such as about 35 µm) is formed over the dielectric layer 501. The metal layer 503 is patterned (e.g., using photolithography and etching) to form the patch antennas (such as 203, 205, 207, and 209 in FIG. 5) and the conductive lines (such as 201 in FIG. 5) of the loadboard 500. A dielectric layer 505, such as a layer of Taconic material having a thickness of about 127 µm, is sandwiched between the metal layer 503 and a metal layer 507, which metal layer 507 may be a copper layer with a thickness of about 35 µm. The metal layer 507 has openings 510 (e.g., through-holes) formed therein. Over the metal layer 507 are a ground plane 511 (e.g., a copper plane of about 18 µm thick) and a dielectric layer 509 between the ground plane 511 and the metal layer 507. The dielectric layers 509 may be formed of, e.g., $FR_4$ material and may have a thickness of about 200 µm. The materials and the dimensions (e.g., thickness) of the loadboard 500 are chosen to provide an RF attenuation level within a target range. Having the metal layers (e.g., 507, 511) in the loadboard 500 may help to adjust RF attenuation of the loadboard 500. In addition, the metal layers may advantageously increase the bandwidth of the loadboard 500 (e.g., the bandwidth of RF signals the loadboard 500 is able to transmit/receive).

FIG. 12A illustrates a top view of a loadboard 600 having a waveguide, and FIG. 12B illustrates the schematic view of the waveguide of the loadboard 600, in an embodiment. The loadboard 600 has a receive antenna 603 and three transmit antennas 605, 607 and 609. A waveguide is formed in the loadboard 600 using vias 601 (e.g., 601A, 601B), which waveguide functions as the coupling network between the receive antenna 603 and the transmit antennas 605, 607 and 609. In the example of FIG. 12A, a first plurality of vias 601A, which extend through the loadboard 600, define a boundary of the waveguide and form an RF isolation structure to contain the RF signal within the boundary of the waveguide. The RF isolation structure comprises conductive pillars (vias 601A) forming a wall-shaped metal fence around the antennas 603, 605, 607 and 609. A second plurality of vias 601B, which are located inside the boundary of the waveguide, define the transmission paths for RF signals. For example, the vias 601B proximate the receive antenna 603 define two transmission paths 641 and 643, and the vias 610B in the center region of the waveguide define three transmission paths 645, 647, and 649. FIG. 12B illustrates the equivalent schematic view of the waveguide of FIG. 12A.

Figure 13:
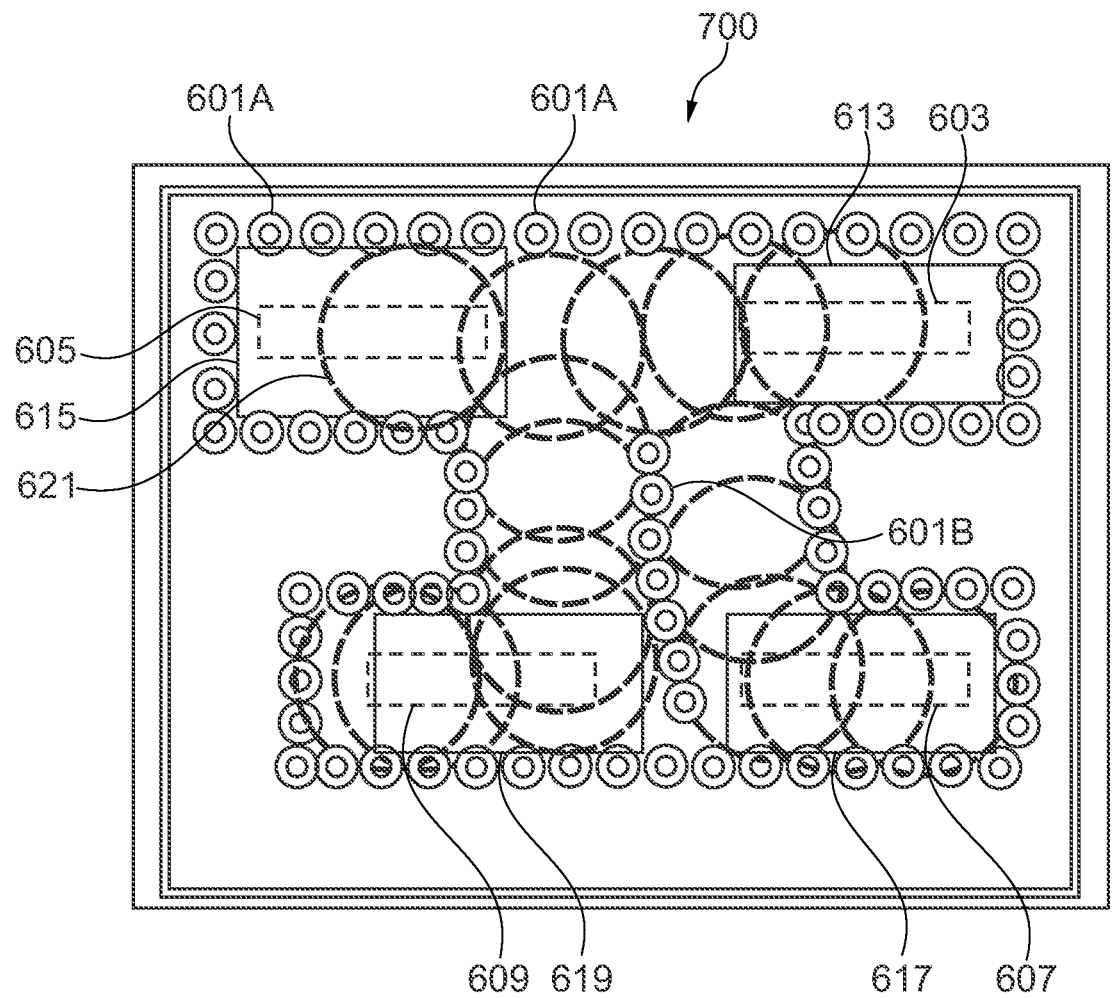
FIG. 13 illustrates a top view of a waveguide in a loadboard, in an embodiment.

FIG. 13 illustrates a top view of another loadboard 700 having a waveguide formed of vias 601 (e.g., 601A and 601B). FIG. 13 also illustrates the locations of the antennas 603, 605, 607, and 609 of the loadboard 700. To illustrate the relative locations of antennas, FIG. 13 further illustrates the locations of the antennas 613, 615, 617, and 619 of the AiP device 150. The circles 621 in FIG. 13 indicate equal distances between each of the antennas 603, 605, 607, and 609 and the vias 601 on opposing sides of the respective antenna. In some embodiments, having equal distances as described above improves the performance of the waveguide formed. In some embodiments, to simply the design and to reduce the design cycle, the waveguide (e.g., 600, 700) is designed for a portion of the whole bandwidth of the waveguide, such as a center portion of the whole frequency band, instead of the whole bandwidth of the waveguide. For example, for a waveguide designed for RF signals in the 57 GHz to 67 GHz range, if the designer tries to optimize the design for the full frequency range of 57~67 GHz, the design constraints may become extremely complicated and the simulation time very long. However, if the designer optimizes the design for a center frequency band, e.g., between 60 GH and 62 GHz, the design constraints are much easier with shorter simulation time, and the performance of the waveguide over the full bandwidth (e.g., between 57~67 GHz) may still meet performance requirements.

In the example of FIG. 13, the locations of the antennas 603, 605, and 607 overlaps with the locations of the antennas 613, 615, and 617, such that during testing of the AiP device 150, the antennas 603, 605, and 607 are disposed directly over respective ones of the antennas 613, 615, and 617. In particular, the antennas 603, 605, and 607 are disposed within the boundaries of the respective ones of the antennas 613, 615, and 617. FIG. 13 further shows the antenna 609 substantially overlapping with the antenna 619, with a portion of the antenna 609 disposed outside of the boundary of the antenna 619 in the top view of FIG. 13. Such partial overlapping may provide flexibility in the design of the waveguide, e.g., the location of the vias 601B between the antennas 609 and 607 may be shifted to the right toward the antenna 607.

Figure 14:
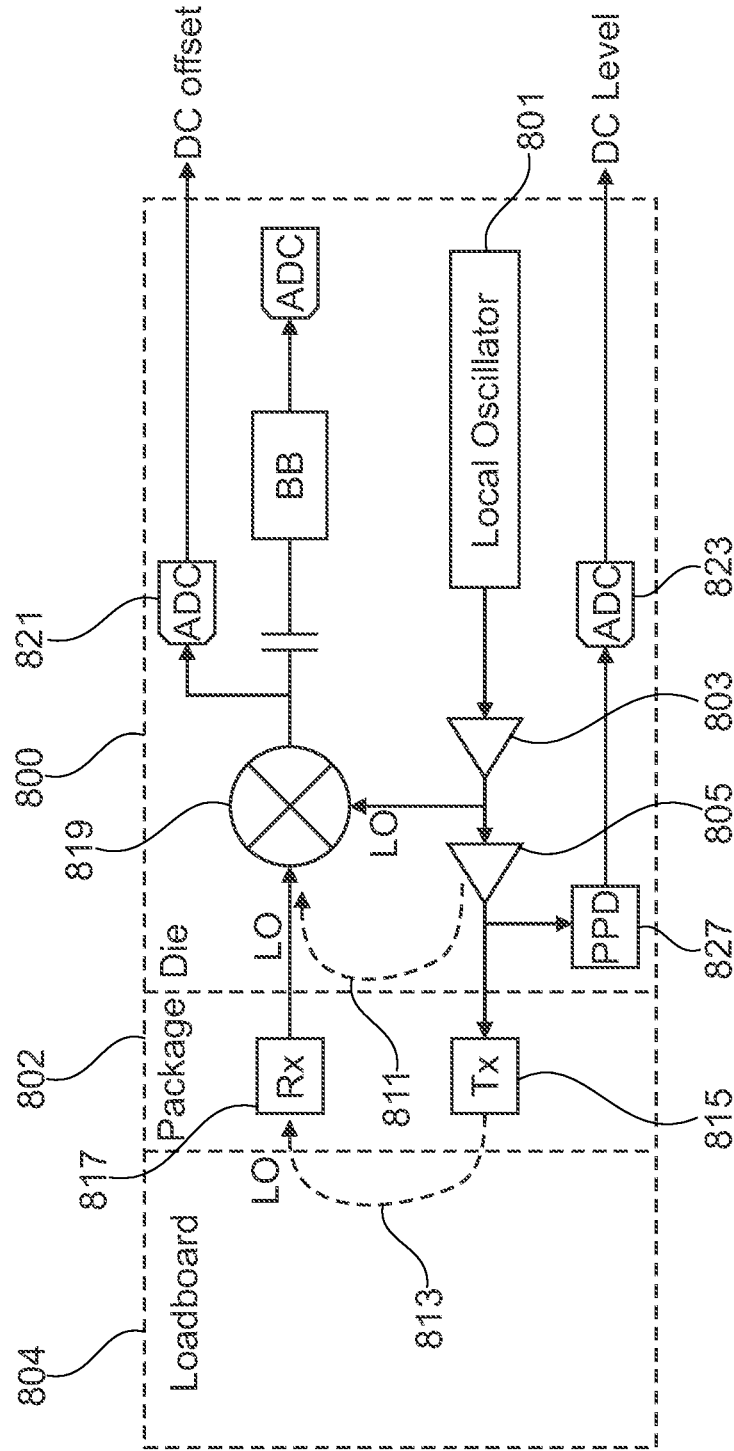
FIG. 14 illustrates a schematic view of a test setup for testing an AiP device, in an embodiment.

FIG. 14 illustrates a schematic view of a test setup for testing the AiP device 150, in an embodiment. In FIG. 14, the dashed rectangular areas illustrate the boundaries of various components in the test setup. For example, the rectangular area 800 (labeled as "Die") represents the boundary of the die 101 (see FIG. 1). The rectangular area 802 (labeled as "Package"), which includes a Tx antenna 815 and a Rx antenna 817, represents the Tx antenna (such as Tx antenna 143 in FIG. 3) and the Rx antenna (such as Rx antenna 145 in FIG. 3) in the package of the AiP device 150 (but outside of the boundary of the die 101). The rectangular area 804 (labeled as "Loadboard") represents a loadboard, which may be, e.g., any of the embodiment loadboards discussed above. Note that for simplicity, not all details of all the components in FIG. 14 are illustrated. For example, the rectangular area 800 illustrates components related to the RF functional test of the AiP device 150, and may omit other components of the die 101. The rectangular area 804 does not illustrate the antennas and the coupling network of the loadboard, and instead, a coupling path 813 (e.g., an electromagnetic coupling path) is used to represent the electromagnetic coupling between the loadboard and the AiP device.

Referring to FIG. 14, during testing of the RF functionality of the AiP device 150, the local oscillator (LO) 801 of the die 101 generates a carrier signal (e.g., a sine wave) having a pre-determined frequency (e.g., a carrier frequency) at the output of the local oscillator 801. The carrier signal is send to amplifiers 803 and 805 (may also be referred to as power amplifiers), and transmitted by the Tx antenna 815 of the AiP device 150. The transmitted RF signal from the Tx antenna 815 is received by the loadboard and transmitted back toward the Rx antenna 817 of the AiP device 150, as indicated by the coupling path 813. The received RF signal at the Rx antenna 817 is sent to a mixer 819. The mixer 819 mixes (e.g., multiplies) the received RF signal with a reference signal, which is the output of the amplifier 803. Therefore, the reference signal is a scaled version of the output of the local oscillator 801, and the output of the mixer 819 is the demodulated signal. Due to the close distance between the loadboard and the AiP device, there are little or no echoes of the transmitted RF signal, in some embodiments. The coupling path 813, however, may introduce a phase delay between the transmitted RF signal at the Tx antenna 815 and the received RF signal at the Rx antenna 817. Recall that the coupling network (e.g., transmission line, or waveguide) in the loadboard may be designed to introduce a pre-determined amount of phase delay, which is equivalent to the phase-delay between the transmitted RF signal and the received RF signal, in the illustrated embodiment.

Since the two input signals to the mixer 819 are two frequency signals having a same frequency and a pre-determined phase shift (between the two frequency signals), the output of the mixer 819 is or comprises a direct-current (DC) signal. The DC signal is then digitized by an analog-to-digital converter (ADC) 821, and the output of the ADC 821 may be used to calculate a DC offset (e.g., by computing an average of the output of the ADC 821), which DC offset indicates the strength the DC signal (e.g., the power of the DC signal).

FIG. 14 also illustrates a power detector 827, which detects the power of the transmitted RF signal. An ADC 823 converts the detected power into digital data, which may be used to indicate or calculate (e.g., calculating an average of the digital data) a DC level of the transmitted RF signal. When the gain settings of the die 101 is known, and when the phase delay caused by the loadboard has a pre-determined value, the difference between the DC offset and the DC level would be expected to be within a pre-determined range for a functioning device. In some embodiments, the DC offset of the demodulated signal is compared with a pre-determined range to determine whether the AiP device is defective, where the pre-determined range may be determined by, e.g., the DC level of the transmitted RF signal and/or the frequency of the transmitted RF signal. The pre-determined range may be determined by theoretical analysis, computer simulations, measurements of the outputs of using test setup, or combinations thereof. For example, for a given RF frequency, based on measurement data using a large number of properly functioning AiP devices, a lookup table may be generated for different DC levels (different transmitted RF signal powers), where for each DC level, an expected range of the DC offset is given for the DC level. The expected range of DC offset may cover the normal spread of properly functioning AiP devices, for example. In some embodiments, during testing of the AiP device, if the DC offset indicated by the output of the ADC 821 is outside the pre-determined range that corresponds to the DC level indicated by the output of the ADC 823, the AiP device 150 is declared to be defective.

FIG. 14 further illustrates a coupling path 811 between the Tx port of the die 101 and the Rx port of the die 101. The coupling path 811 may be activated (e.g., connected) by, e.g., setting a control bit in a control register of the die 101, which coupling path 811 loops the RF signal at the Tx port back to the Rx port of the die 101 and introduces a pre-determined phase delay. In the illustrated embodiment, when the coupling path 811 is activated, the coupling path 813 is disabled (e.g., the RF signal from Tx port of the die 101 is not sent to the Tx antenna 815). Having the coupling paths 811 and 813 allow for the ability to identify whether the RF function test failure occurs inside the die 101 or outside the die 101 (e.g., somewhere in the connections between the die 101 and the integrated Tx/Rx antennas of the AiP device). For example, if the AiP device 150 fails the RF function test, an additional test may be performed with the coupling path 811 enabled (and the coupling path 813 disabled). If the additional test passes (e.g., the DC offset is within a second pre-determined range which may be different from the pre-determined range for testing the AiP device 150 using the coupling path 813), the die 101 is considered to be functioning properly, and the RF test failure is considered to have occurred somewhere between the die 101 and the Tx/Rx antennas of the AiP device 150.

Figure 15A:
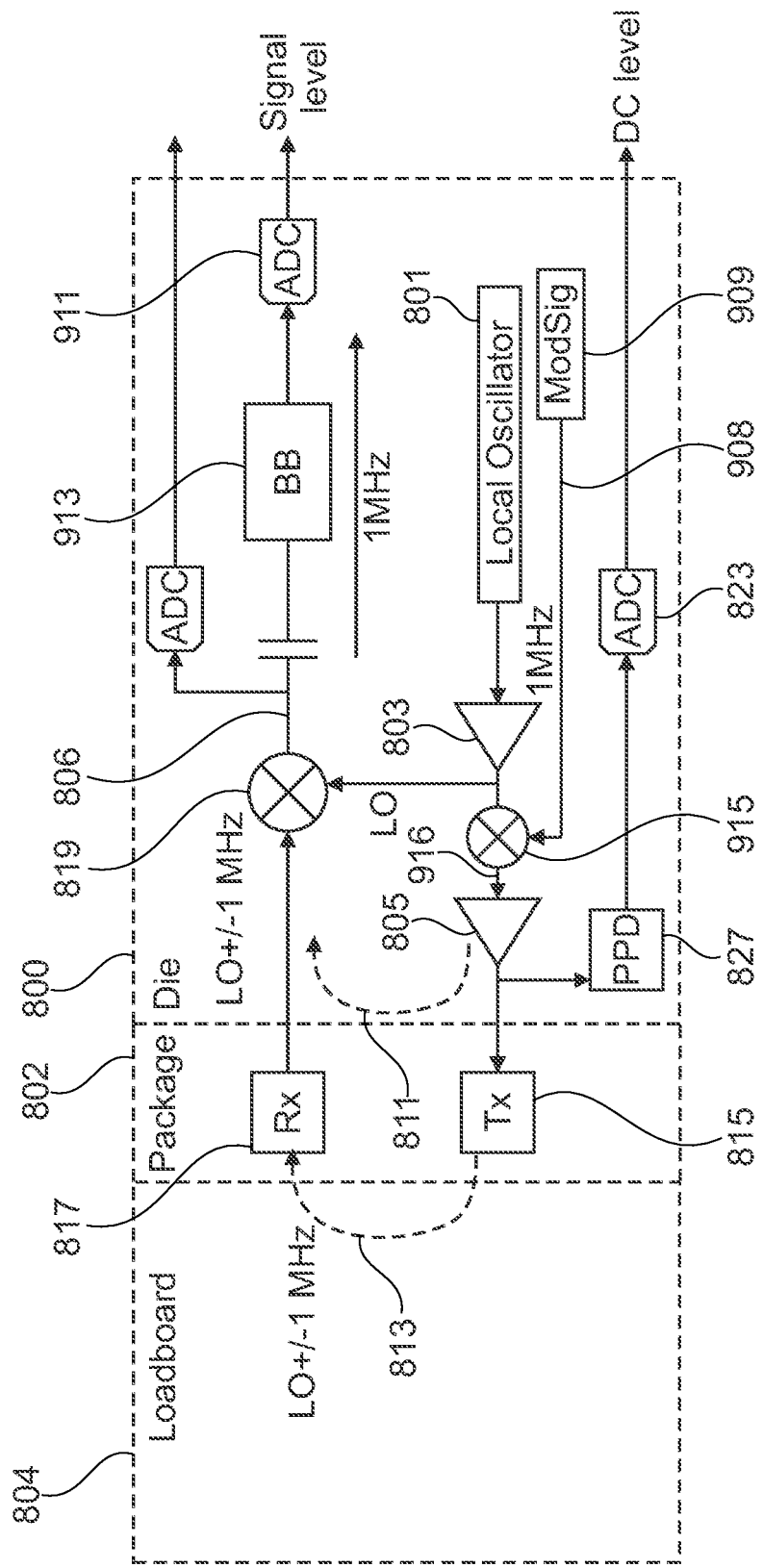
FIGS. 15A and 15B illustrate schematic views of a test setup for testing an AiP device, in an embodiment.
Figure 15B:
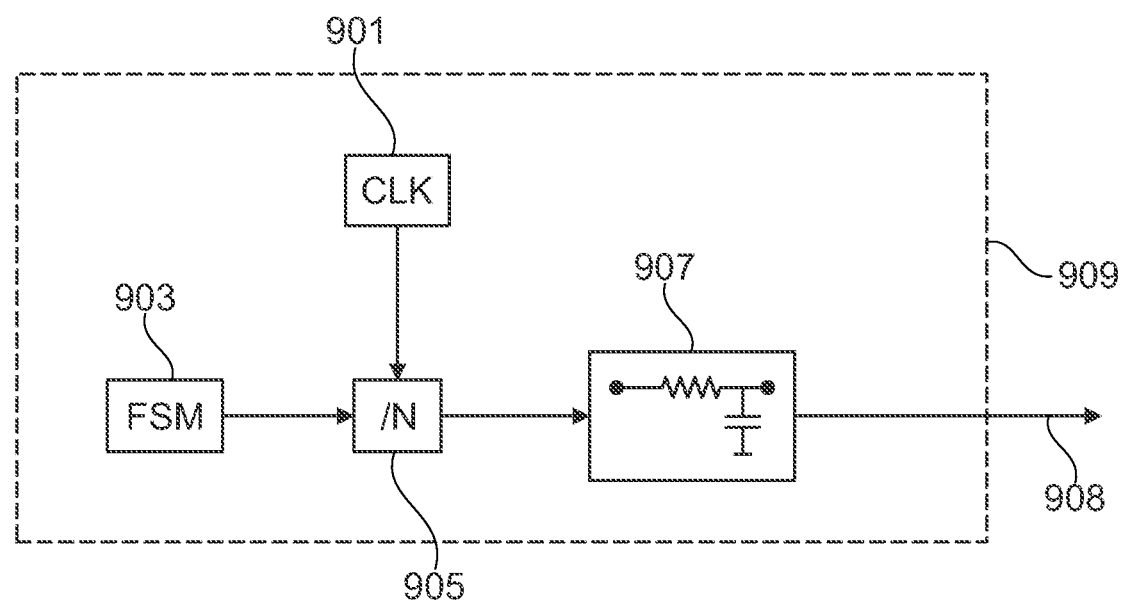

FIGS. 15A and 15B illustrate schematic views of a test setup for testing the AiP device, in another embodiment. The test setup in FIG. 15A is similar to that in FIG. 14, but with the transmitted RF signal generated differently. In particular, the local oscillator 801 generates the carrier signal (e.g., a sine wave) having a pre-determined frequency (e.g., a carrier frequency $F_c$) at the output of the local oscillator 801. The carrier signal is send to amplifiers 803, and the output of the amplified 803 is sent to a mixer 915. The mixer 915 mixes (e.g., modulates, or multiplies) the output of the amplified 803 (e.g., a scaled version of the output signal of the local oscillator 801) with a modulating signal 908, which modulating signal 908 is (or closely resembles) a sine wave and is generated by a modulating signal generator 909. Details of the modulating signal generator 909 is discussed hereinafter with reference to FIG. 15B. One skilled in the art will appreciate that the modulation scheme in FIG. 15A is a frequency modulation, and the signal 916 has spectrum component (e.g., two spectrum peaks) at $F_c \pm F_{mod}$, where $F_c$ is the carrier frequency, and $F_{mod}$ is the frequency of the modulating signal 908. In the example above, output of the mixer 915 has spectrum components at $F_c \pm 1$ MHz.

Referring temporarily to FIG. 15B, the modulating signal generator 909 includes a clock generator 901, a digital logic block 903, a divider 905, and a low-pass filter 907. The clock generator 901 generates a clock signal having a pre-determined frequency, such as a square wave having a frequency of, e.g., 80 MHz. The clock signal is divided by the divider 905 by a ratio of N to generate a clock signal with a lower frequency. For example, the divider 905 divides the 80 MHz square wave from the clock generator 901 by a ratio of 80 to generate a square wave having a frequency of 1 MHz. The dividing ratio N of the divider 905 may be programmable and may be controlled by the digital logic block 903, which may be a finite state machine (FSM). The output of the divider 905, which is a square wave having a frequency of 1 MHz in the example above, is filtered by the low-pass filter 907, and the output of the low-pass filter 907 is the modulating signal 908, which closely resembles a sine wave having a same frequency (e.g., 1 MHz) as the square wave at the output of the divider 905.

Referring back to FIG. 15A, the signal 916 at the output of the mixer 915 is amplified by the amplifier 805 and transmitted by the Tx antenna 815 of the AiP device 150. The transmitted RF signal from the Tx antenna 815 is received by the loadboard and transmitted back toward the Rx antenna 817, as indicated by the coupling path 813. The received RF signal at the Rx antenna 817 is sent to the mixer 819. The mixer 819 demodulates the received RF signal by mixing (e.g., multiplying) the received RF signal with a reference signal, which is a scaled version of the output of the local oscillator 801, and the output of the mixer 819 is the demodulated signal.

Since the received RF signal has a frequency shift (e.g., 1 MHz) from the reference signal, the signal 806 at the output of the mixer 819 is an AC signal (e.g., a sine wave, a tone) having frequency components at $F_{mod}$, which is the frequency of the modulating signal 908. As illustrated in FIG. 15A, the signal 806 is coupled through a capacitor and sent to a base band processing block 913. The base band processing block 913 may include a low-pass filter to filter out high frequency noise and to prevent aliasing in the subsequent analog-to-digital conversion. The base band processing block 913 may also include a band-pass filter to filter out the DC component of the demodulated signal 806. The output of the base band processing block 913 is then converted into digital data by an ADC 911, and the digital data are used to form an estimate of the signal level of the AC signal. For example, the digital data from the ADC 911 may be analyzed by performing, e.g., a Fast Fourier Transform (FFT) or the like, to find out the frequency and/or the strength of the signal 806 (e.g., a tone), where the amplitude of the frequency peak after the FFT may be used to indicate the signal level of the signal 806.

In some embodiments, the signal level of the signal 806 is compared with a pre-determined range which may be based on the signal level of the transmitted RF signal. The signal level of the transmitted RF signal corresponds to the strength (e.g., signal level) of the frequency peak in the spectrum of the transmitted RF signal, in some embodiments. If the signal level of the signal 806 is outside the pre-determined range that corresponds to the signal level of the transmitted RF signal, the AiP device 150 is declared to be defective. The pre-determined range may be determined by theoretical analysis, computer simulations, measurements of the outputs of the test setup, or combinations thereof. In some embodiments, a lookup table may be pre-generated for a plurality of signal levels of the transmitted RF signal, where for each signal level of the transmitted RF signal, a pre-determined range for the signal level of the signal 806 is generated. For example, a threshold could be defined for each signal level of the transmitted RF signal, and if the signal level of the signal 806 is below the threshold, the device may be declared defective.

Figure 16:
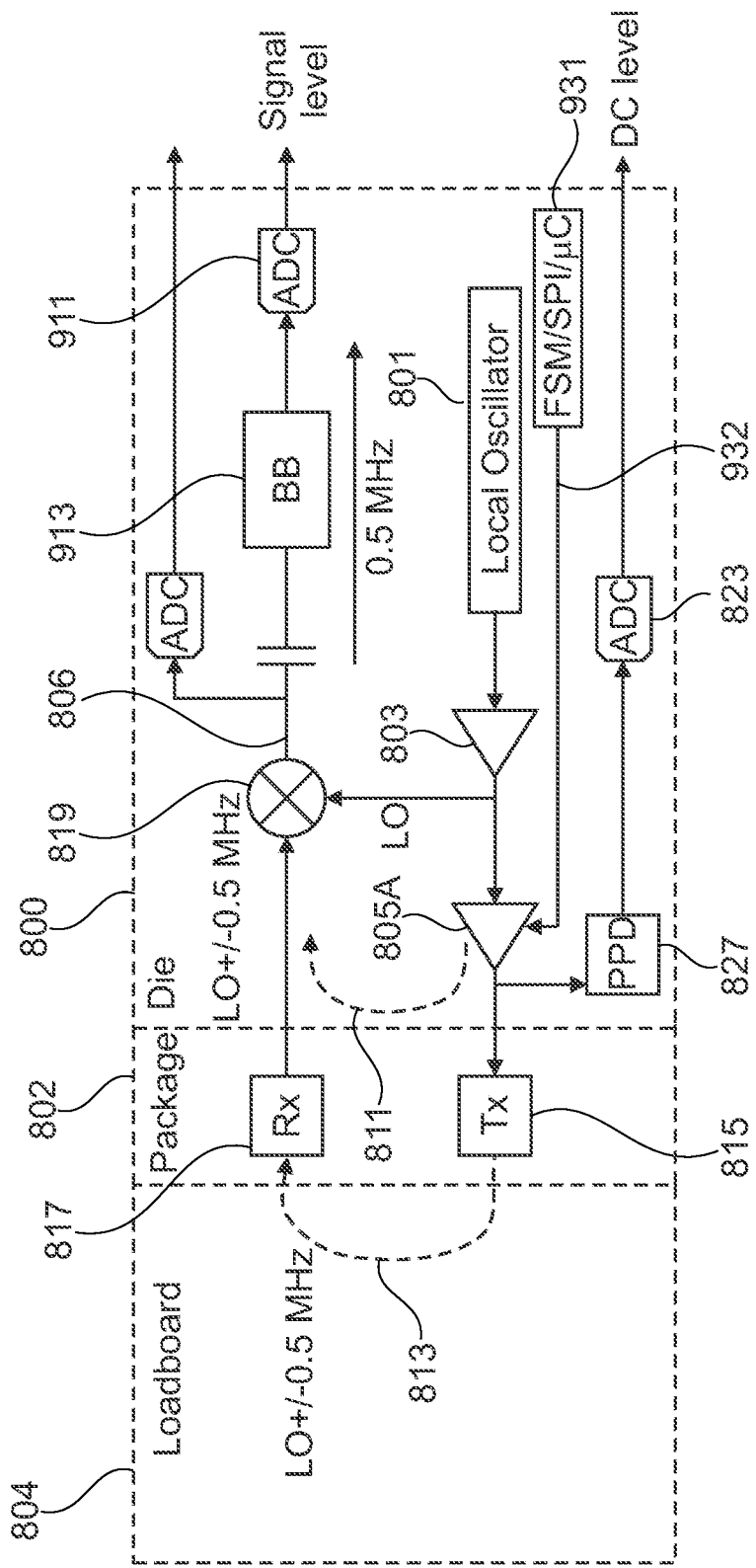
FIG. 16 illustrates a schematic view of a test setup for testing an AiP device, in an embodiment.

FIG. 16 illustrates a schematic view of a test setup for testing the AiP device, in yet another embodiment. The test setup in FIG. 16 is similar to that of FIG. 15A, but without the mixer 915 and with a different modulation method. In particular, the local oscillator 801 generates a carrier signal (e.g., a tone) having a pre-determined frequency (e.g., a carrier frequency), which carrier signal is amplified by the amplifier 803 and an amplifier 805A. The amplifier 805A has an enable terminal that controls the operation (e.g., turning ON or OFF) of the amplifier 805A. A digital control block 931 generates a control signal 932, which may be a square wave having a pre-determined frequency (e.g., between about 300 kHz and about 500 kHz, such as 500 kHz). The control signal 932 (e.g., a square wave) is connected to the enable terminal of the amplifier 805A and functions as an enable signal to control the operation of the amplifier 805A. In some embodiments, when the control signal 932 has a logic "1" value (or logic "0" value), the amplifier 805A outputs the amplified carrier signal; when the control signal 932 has a logic "0" value (or logic "1" value), the output of the amplifier 805A is disabled (e.g., no output is generated). In other words, the control signal 932 (e.g., a modulating signal) modulates a scaled version of the output signal (e.g., a carrier signal) of the local oscillator 801 to generate the RF signal being transmitted. Therefore, the modulation method for the RF transmission in FIG. 16 is an On-Off Keying (OOK) modulation method. One skilled in the art will appreciate that the RF signal transmitted by the antenna 815 in FIG. 16, which is OOK modulated, comprises tones having frequencies shifted from the carrier frequency by the frequency of the control signal 932. In the example above, the transmitted RF signal has frequencies at $F_c \pm 0.5$ MHz.

The test setup in FIG. 16 does not use a mixer for modulation, and provides easy control on the frequency shift of the RF signal. By changing the frequency of the control signal 932, the frequency shift of the RF signal is easily changed. The digital control block 931 may be an FSM, a digital interface (such as a Serial Peripheral Interface (SPI) for accepting a control square wave from another functional block), a micro-controller (e.g., with a software program to generate a square wave as the control signal 932), or the like. Although FIG. 16 shows the digital control block 931 as being inside the die 101, the digital control block 931 (e.g., an FSM, or a micro-controller) may be located outside the die 101 and may provide the control signal 932 (e.g., a square wave) through a digital interface of the die 101.

Demodulation of the received RF signal and calculation of the signal level of the demodulated signal 806 are the same or similar to the process discussed above with reference to FIG. 15A, thus may not be repeated. In some embodiments, the mixer 819 demodulate the received RF signal by mixing the received RF signal with a reference signal (e.g., a scaled version of the output signal of the local oscillator 8oi). In the illustrated embodiment, the demodulated signal 806 has a pre-determined frequency component (e.g., a tone) at a frequency (e.g., 0.5 MHz) equal to the frequency of the control signal 932. The signal level of the demodulated signal 806 is compared with a pre-determined range, which may be based on the signal level of the transmitted RF signal, and if the signal level of the demodulated signal 806 is outside the pre-determined range that corresponds to the signal level of the transmitted RF signal, the AiP device 150 is declared to be defective. The pre-determined range may be determined by theoretical analysis, computer simulations, measurements of the outputs of the test setup, or combinations thereof. In some embodiments, a lookup table may be pre-generated for a plurality of signal levels of the transmitted RF signal, where for each signal level of the transmitted RF signal, a pre-determined range for the demodulated signal 806 is generated.

Figure 17:
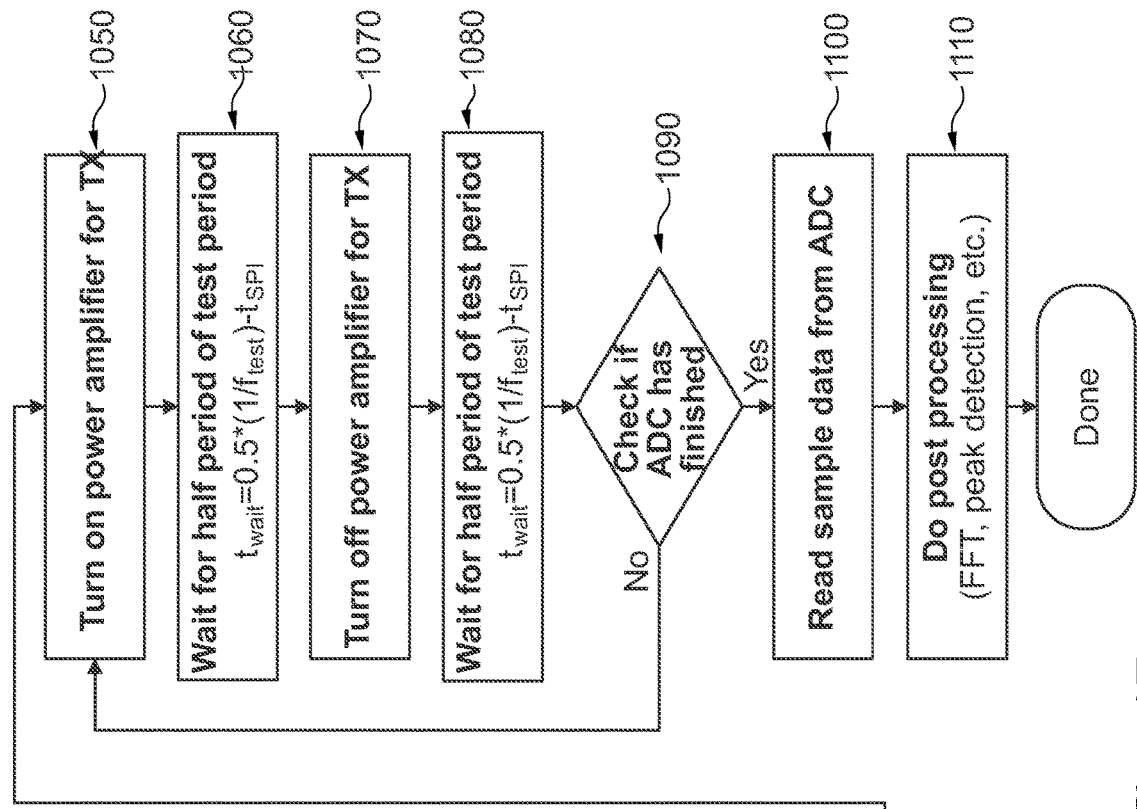
FIG. 17 is a flow chart of processing steps for testing an AiP device using the test setup of FIG. 16, in an embodiment.
Figure 17:
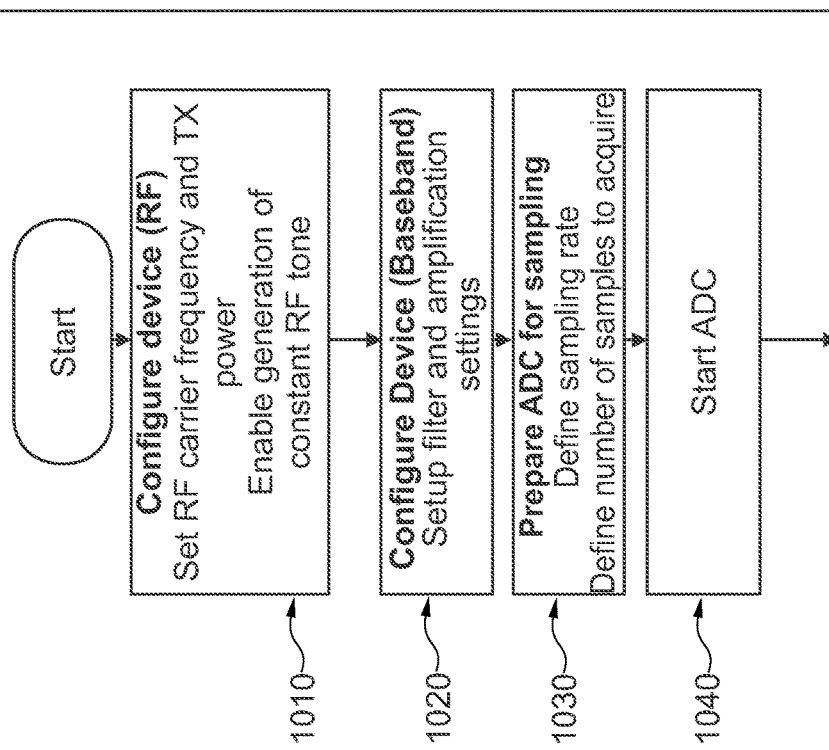

FIG. 17 is a flow chart of processing steps for testing an AiP device using the test setup of FIG. 16, in an embodiment. Referring to FIG. 17, at step 1010, the RF portion of the AiP device is configured. For example, the carrier frequency of the carrier signal generated by the local oscillator 801 is set, and the RF power of the transmitter (e.g., gains of the amplifiers 803/805) are set. The local oscillator 801 is enabled to generate the carrier signal. At step 1020, the base band processing block 913 is configured. For example, parameters of the filters inside the base band processing block 913 are set, and amplification setting of the base band processing block 913 is also set. At step 1030, parameters for the ADC 911 are set in preparation for sampling. For example, the sampling rate and the number of samples to acquire are set for the ADC 911. The setting for the ADC 823 may also be set. At step 1040, the ADC 911 is started. At step 1050, the power amplifier 805 is turned on to start transmitting the RF signal. The power amplifier 805 may be turned on by a control signal received from, e.g., an SPI interface. At step 1060, after the power amplifier 805 is turned on, wait (e.g., no new operation is performed) for a period of $t_{wait}=0.5*(1/f_{test})-t_{SPI}$, where $f_{test}$ is the frequency of the control signal 932, and $t_{SPI}$ is the time used to turn on the power amplifier 805 through the SPI interface. In other words, the power amplifier 805 is turned on for half of a period of the control signal 932. At step 1070, the power amplifier 805 is turned off, e.g., by a control signal received through the SIP interface. At step 1080, after the power amplifier 805 is turned off, wait (e.g., no new operation is performed) for a period of $t_{wait}=0.5*(1/f_{test})-t_{SPI}$. In other words, the power amplifier 805 is turned off for half of a period of the control signal 932. At step 1090, the number of output samples from the ADC 911 is checked to determine if a target number of ADC samples have been acquired. If no, the processing goes back to step 1050, where the power amplifier 805 is turned on for half a period, and turned off for half a period again while the ADC 911 continues sampling. If the target number of ADC samples have been acquired, processing proceeds to step 1100, where the ADC output samples are read. The ADC 911 may be turned off once the target number of ADC samples has been acquired. In step 1110, the ADC samples are processed by post processing algorithms, which may be performed on the die 101, or off the die 101 such as by a test engineer using a desktop computer. The post processing may include performing FFT on the collected ADC samples, performing peak detection to the outputs of the FFT to find peaks in the frequency. For example, the location of the peak indicates the frequency of the signal 806 (e.g., a tone), and the amplitude of the peak indicates the signal level (e.g., signal strength) of the signal 806. The signal level of the signal 806 may be used to determine if the AiP device is defective, as discussed previously.

Figure 18:
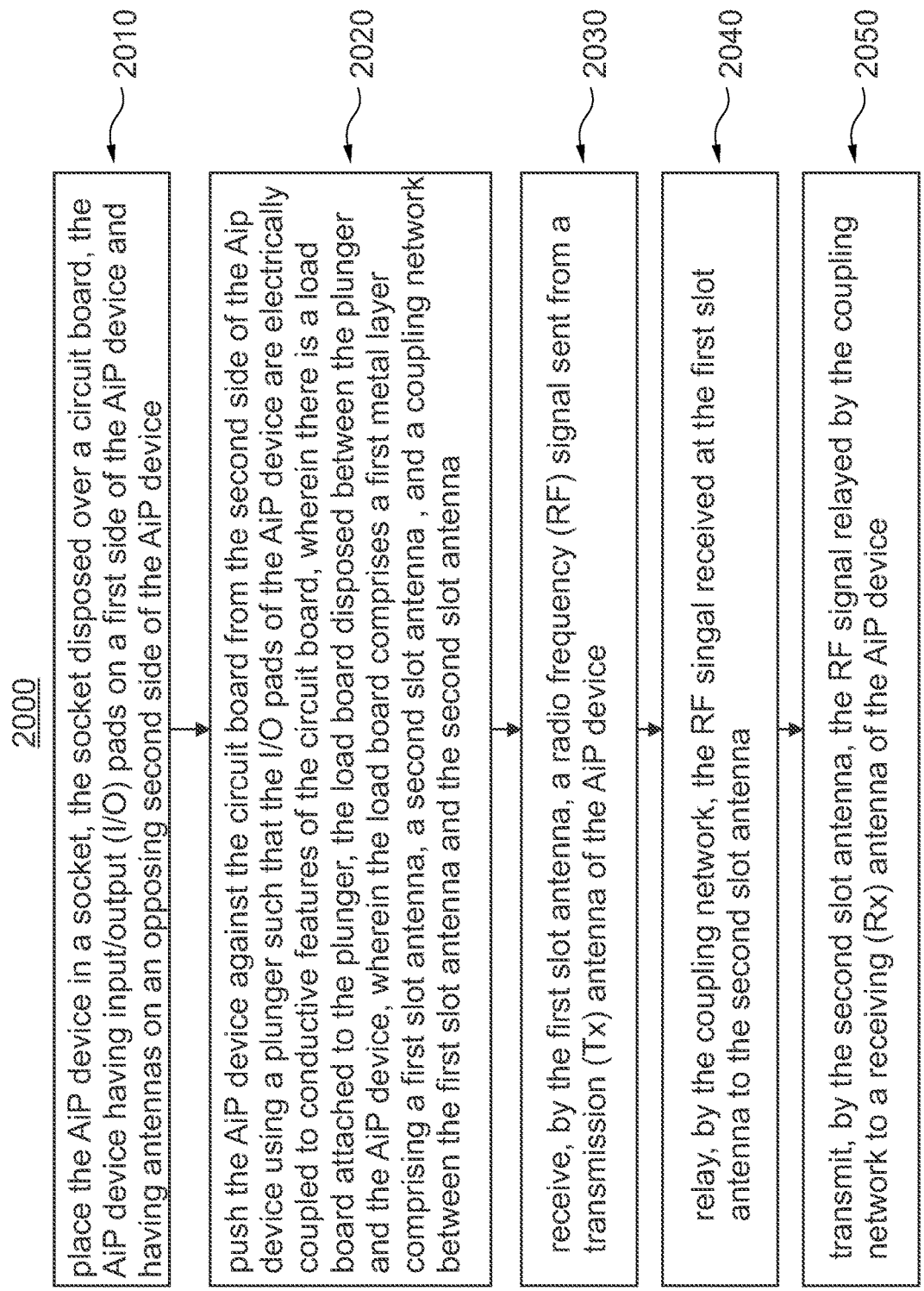
FIG. 18 is a flow chart of a method of testing an AiP device, in an embodiment.

FIG. 18 illustrates a flow chart of a method 2000 of testing an AiP device, in accordance with some embodiments. It should be understood that the embodiment method shown in FIG. 18 is merely an example of many possible embodiment methods. One of ordinary skill in the art would recognize many variations, alternatives, and modifications. For example, various steps as illustrated in FIG. 18 may be added, removed, replaced, rearranged and repeated.

Referring to FIG. 18, at step 2010, the AiP device is placed in a socket disposed over a circuit board, the AiP device having input/output (I/O) pads on a first side of the AiP device and having antennas on an opposing second side of the AiP device. At step 2020, the AiP device is pushed against the circuit board from the second side of the AiP device using a plunger such that the I/O pads of the AiP device are electrically coupled to conductive features of the circuit board, wherein there is a loadboard attached to the plunger, the loadboard disposed between the plunger and the AiP device, wherein the loadboard comprises a first metal layer comprising a first slot antenna, a second slot antenna, and a coupling network between the first slot antenna and the second slot antenna. At step 2030, the first slot antenna receives a radio frequency (RF) signal sent from a transmission (Tx) antenna of the AiP device. At step 2040, the coupling network replays the RF signal received at the first slot antenna to the second slot antenna. At step 2050, the second slot antenna transmits the RF signal relayed by the coupling network to a receiving (Rx) antenna of the AiP device.

Embodiments may achieve advantages. For example, various embodiment loadboards may be used in the test assembly to test AiP devices and identify defective AiP devices. The structure of the loadboards allows for fine turning of the RF attenuation of the loadboards for proper testing of the RF circuitry, and achieves wide bandwidth for the loadboards. The through-holes in the loadboard allows the plunger to pick up the loadboard and the AiP device at the same time for easy handling, thus reducing the testing time and reduces the cost of product testing. The disclosed test methods provide easy and flexible ways to test the AiP devices. The dual coupling paths 813 and 811 allows for more granularity in determining the failure point within the AiP device.

Example embodiments of the present invention are summarized here. Other embodiments can also be understood from the entirety of the specification and the claims filed herein.

Example 1. A test assembly for testing an antenna-in-package (AiP) device, the test assembly includes a socket over a first surface of a circuit board, wherein the socket comprises an opening for receiving the AiP device during testing of the AiP device; a plunger configured to move along sidewalls of the opening of the socket, wherein during the testing of the AiP device, the plunger is configured to cause the AiP device to be pressed towards the circuit board such that the AiP device is operatively coupled to the circuit board via input/output (I/O) connections of the AiP device and of the circuit board; and a loadboard disposed within the socket and between the plunger and the AiP device, wherein the loadboard comprises a coupling structure configured to be electromagnetically coupled to a transmit antenna of the AiP device and to a receive antenna of the AiP device, so that testing signals transmitted by the transmit antenna of the AiP device are conveyed to the receive antenna of the AiP device externally relative to the AiP device through the coupling structure.

Example 2. The test assembly of example 1, further comprising the circuit board.

Example 3. The test assembly of example 1, wherein the coupling structure comprises a first antenna and a second antenna, wherein the first antenna is configured to be electromagnetically coupled to the transmit antenna of the AiP device and the second antenna is configured to be electromagnetically coupled to the receive antenna of the AiP device during the testing of the AiP device.

Example 4. The test assembly of example 3, further comprising a coupling network configured to couple the first antenna to the second antenna such that during the testing of the AiP device, the testing signals are conveyed from the transmit antenna to the receive antenna through both the coupling structure of the loadboard and the coupling network.

Example 5. The test assembly of example 4, wherein the loadboard comprises the coupling network.

Example 6. The test assembly of example 4, wherein the plunger comprises the coupling network.

Example 7. The test assembly of example 4, wherein the coupling network comprises a waveguide.

Example 8. The test assembly of example 7, wherein the waveguide comprises conductive vias extending through the loadboard, wherein the conductive vias comprise: a first plurality of vias forming an radio frequency (RF) isolation structure defining a perimeter of the waveguide; and a second plurality of vias inside the perimeter of the waveguide, the second plurality of vias defining transmission paths of an RF signal in the waveguide.

Example 9. The test assembly of example 4, wherein the coupling network is configured to generate a pre-determined phase delay between an input radio frequency (RF) signal of the coupling network and an output RF signal of the coupling network.

Example 10. The test assembly of example 1, further comprising a spacer configured to be disposed between the loadboard and the AiP device during the testing of the AiP device.

Example 11. The test assembly of example 10, wherein the spacer has openings extending through the spacer.

Example 12. The test assembly of example 11, wherein during the testing of the AiP device, the openings of the spacer are aligned with respective ones of the transmit antenna and the receive antenna of the AiP device.

Example 13. A loadboard for testing an antenna-in-package (AiP) device includes a first metal layer proximate to a first side of the loadboard, the first metal layer comprising metal patterns that include a coupling structure, the coupling structure comprising a first antenna and a second antenna, wherein during testing, the first side of the loadboard is configured to face the AiP device, wherein the AiP device has a transmit (Tx) antenna and a receive (Rx) antenna, wherein during the testing, the first antenna is configured to be electromagnetically coupled to the Tx antenna, and the second antenna is configured to be electromagnetically coupled to the Rx antenna such that testing signals transmitted by the transmit antenna of the AiP device are conveyed to the receive antenna of the AiP device externally relative to the AiP device through the coupling structure; a first ground plane proximate to a second side of the loadboard opposing the first side of the loadboard; and first dielectric layers between the first metal layer and the first ground plane.

Example 14. The loadboard of example 13, further comprising a coupling network configured to couple the first antenna with the second antenna during the testing.

Example 15. The loadboard of example 14, wherein the coupling network comprises a waveguide.

Example 16. The loadboard of example 13, further comprising a plurality of through-holes extending from the first side of the loadboard to the second side of the loadboard.

Example 17. The loadboard of example 13, further comprising a second dielectric layer disposed along the first metal layer, wherein the first metal layer is between the second dielectric layer and the first dielectric layers.

Example 18. The loadboard of example 17, wherein the second dielectric layer is configured to physically contact the AiP device during the testing, wherein a thickness of the second dielectric layer is between about 200 μm and about 300 μm.

Example 19. A method of testing an antenna-in-package (AiP) device includes placing the AiP device in an opening of a socket, the socket disposed over a circuit board; moving a plunger along sidewalls of the opening to cause the AiP device to be pressed toward the circuit board such that the AiP device is electrically coupled to the circuit board via input/output connections of the AiP device and of the circuit board, wherein a loadboard is disposed between the plunger and the AiP device while moving the plunger, wherein the loadboard comprises a coupling structure including a first antenna and a second antenna; receiving, by the first antenna, a radio frequency (RF) signal sent from a transmit (Tx) antenna of the AiP device; relaying, by a coupling network, the RF signal received at the first antenna to the second antenna; and transmitting, by the second antenna, the RF signal relayed by the coupling network to a receive (Rx) antenna of the AiP device.

Example 20. The method of example 19, wherein the RF signal at the Tx antenna of the AiP device is generated by the AiP device by modulating an output signal of a local oscillator (LO) with a modulating signal, wherein the method further comprises: mixing, by the AiP device, the RF signal received at the Rx antenna with a reference signal to produce a demodulated signal having a pre-determined frequency component; and detecting a signal level of the pre-determined frequency component of the demodulated signal.

Example 21. The method of example 20, wherein the modulating signal is an enable signal with a pre-determined frequency, wherein modulating the output signal of the LO comprises alternately enabling and disabling transmission of the output signal of the LO at the Tx antenna based on the enable signal.

Example 22. The method of example 20, further comprising: determining if the detected signal level of the pre-determined frequency component of the demodulated signal is within a pre-determined range; and determining that the AiP device is defective upon detection that the detected signal level is outside the pre-determined range.

Example 23. The method of example 19, wherein the RF signal at the Tx antenna of the AiP device is generated by the AiP device by transmitting a local oscillator (LO) signal, wherein the coupling network introduces a phase delay between an input and an output of the coupling network, wherein the method further comprises: mixing, by a mixer of the AiP device, the RF signal received at the Rx antenna with the LO signal to produce a demodulated signal having a first DC offset, wherein the RF signal received at the Rx antenna is coupled to a first input terminal of the mixer, and the LO signal is coupled to a second input terminal of the mixer; and detecting a first signal strength of the first DC offset.

Example 24. The method of example 23, further comprising, in response to detecting that the first signal strength of the first DC offset is outside a first pre-determined range: stopping sending the RF signal from the Tx antenna of the AiP device; coupling the LO signal to the first input terminal and the second input terminal of the mixer, thereby producing another demodulated signal having a second DC offset; detecting a second signal strength of the second DC offset; and comparing the second signal strength with a second pre-determined range.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of testing an antenna-in-package (AiP) device, the method comprising:
   placing the AiP device in an opening of a socket, the socket disposed over a circuit board;
   placing a loadboard in the opening of the socket over the AiP device, the loadboard comprising a coupling structure that includes a first antenna and a second antenna;
   pressing the loadboard by moving a plunger along sidewalls of the opening toward the circuit board, wherein pressing the loadboard causes the AiP device to be pressed toward the circuit board and electrically coupled to the circuit board via input/output connections of the AiP device and of the circuit board;
   receiving, by the first antenna of the loadboard, a radio frequency (RF) signal sent from a transmit (Tx) antenna of the AiP device;
   relaying, by a coupling network, the RF signal received at the first antenna to the second antenna, wherein the coupling network is configured to generate a pre-determined phase delay between the RF signal at the first antenna and the RF signal at the second antenna; and
   transmitting, by the second antenna of the loadboard, the RF signal back to a receive (Rx) antenna of the AiP device.

2. The method of claim 1, wherein the coupling network comprises a transmission line in the loadboard between the first antenna and the second antenna.

3. The method of claim 1, wherein the coupling network comprises a waveguide in the plunger, wherein the waveguide is configured to couple the RF signal received at the first antenna to the second antenna during the testing of the AiP device.

4. The method of claim 1, further comprising, after placing the AiP device and before placing the loadboard, placing a spacer in the opening of the socket on the AiP device.

5. The method of claim 4, wherein the spacer has a first opening and a second opening that extend through the spacer, wherein placing the spacer comprises aligning the first opening and the second opening with the Tx antenna and the Rx antenna of the AiP device, respectively, such that after placing the loadboard, the first opening is between the Tx antenna and the first antenna, and the second opening is between the Rx antenna and the second antenna.

6. The method of claim 1, further comprising:
   measuring a first signal power of the RF signal sent by the Tx antenna of the AiP device;
   measuring a second signal power of a first demodulated signal in the AiP device;
   calculating a first difference between the first signal power and the second signal power; and
   in response to detecting that the first difference is outside a first pre-determined range, declaring that the AiP device is defective.

7. The method of claim 6, further comprising generating the first demodulated signal by mixing, using a mixer of the AiP device, the RF signal received by the Rx antenna of the AiP device with an output signal of a local oscillator (LO) of the AiP device.

8. The method of claim 7, further comprising, after declaring that the AiP device is defective:
   stopping transmitting the RF signal by the Tx antenna of the AiP device; and
   coupling the RF signal to the mixer of the AiP device through an internal coupling path of the AiP device.

9. The method of claim 8, further comprising:
   measuring a third signal power of a second demodulated signal in the AiP device;
   calculating a second difference between the first signal power and the third signal power; and
   in response to detecting that the second difference is within a second pre-determined range, declaring that a die of the AiP device is functioning properly.

10. The method of claim 1, wherein during the pressing, the loadboard is interposed between the plunger and the AiP device.

11. The method of claim 9, further comprising, generating the second demodulated signal by mixing, using the mixer of the AiP device, the RF signal received through the internal coupling path of the AiP device with the output signal of the local oscillator (LO) of the AiP device.

12. A method of testing an antenna-in-package (AiP) device, the method comprising:
   pressing an AiP device disposed within an opening of a socket toward a circuit board such that the AiP device is electrically coupled to the circuit board via input/output connections of the AiP device and of the circuit board;
   transmitting, by a transmit (Tx) antenna of the AiP device, a radio frequency (RF) signal;
   receiving, by a first antenna of a loadboard, the RF signal, wherein the loadboard is disposed in the opening of the socket over the AiP device;
   relaying, by a coupling network, the RF signal from the first antenna to a second antenna of the loadboard;
   receiving, by a receive (Rx) antenna of the AiP device, the RF signal transmitted by the second antenna of the loadboard;
   demodulating the RF signal received by the Rx antenna of the AiP device to generate a first demodulated signal;
   detecting a power of the first demodulated signal;
   comparing the power of the first demodulated signal with a power of the RF signal transmitted by the Tx antenna of the AiP device; and
   determining that the AiP device is defective if a difference between the power of the first demodulated signal and the power of the RF signal is outside a first pre-determined range.

13. The method of claim 12, wherein the coupling network is configured to generate a pre-determined phase delay between the RF signal at the first antenna and the RF signal at the second antenna.

14. The method of claim 12, wherein the demodulating the RF signal comprises mixing the RF signal received at the Rx antenna with an output signal of a local oscillator (LO), wherein a frequency of the output signal of the LO is a same as a carrier frequency of the RF signal.

15. The method of claim 12, further comprising, in response to determining that the AiP device is defective:
   stopping transmitting the RF signal through the Tx antenna of the AiP device;
   looping the RF signal back to a mixer of the AiP device through an internal coupling path of the AiP device; and
   demodulating the RF signal to generate a second demodulator signal.

16. The method of claim 15, further comprising:
   detecting a power of the second demodulated signal; and
   determining that a die of the AiP device is functional if a difference between the power of the second demodulated signal and the power of the RF signal is within a second pre-determined range.

17. A method of testing an antenna-in-package (AiP) device, the method comprising:
   placing a loadboard on the AiP device, wherein the loadboard has a first antenna and a second antenna that are aligned with a transmit (Tx) antenna of the AiP device and a receive (Rx) antenna of the AiP device, respectively;
   receiving, by the first antenna of the loadboard, a radio frequency (RF) signal transmitted by the Tx antenna of the AiP device;
   relaying, by a coupling network, the RF signal from the first antenna to the second antenna of the loadboard;
   transmitting, by the second antenna of the loadboard, the relayed RF signal to the Rx antenna of the AiP device;
   mixing, by a mixer of the AiP device, the RF signal received at the Rx antenna with an output signal of a local oscillator (LO) to produce a demodulated signal having a pre-determined frequency component;
   detecting a signal level of the pre-determined frequency component of the demodulated signal; and
   determining that the AiP device is defective upon detection that the detected signal level differs from a power of the RF signal by more than a pre-determined threshold.

18. The method of claim 17, wherein the RF signal is generated in the AiP device by modulating the output signal of the LO with a modulating signal.

19. The method of claim 18, wherein the modulating signal is an enable signal with a pre-determined frequency, wherein modulating the output signal of the LO comprises alternately enabling and disabling transmission of the output signal of the LO at the Tx antenna based on the enable signal.

20. The method of claim 17, wherein the RF signal is generated in the AiP device by amplifying the output signal of the LO, wherein the pre-determined frequency component of the demodulated signal is a direct-current (DC) component.

* * * * *